US011573098B1

(12) United States Patent
Shah et al.

(10) Patent No.: US 11,573,098 B1
(45) Date of Patent: Feb. 7, 2023

(54) METHOD AND SYSTEM TO DETECT NON-TECHNICAL LOSSES IN AN ELECTRICAL POWER SYSTEM

(71) Applicant: KING FAHD UNIVERSITY OF PETROLEUM AND MINERALS, Dhahran (SA)

(72) Inventors: Abdullah L. Shah, Dhahran (SA); Ali T. Al-Awami, Dhahran (SA); Wessam A. Mesbah, Dhahran (SA)

(73) Assignee: KING FAHD UNIVERSITY OF PETROLEUM AND MINERALS, Dhahran (SA)

( * ) Notice: Subject to any disclaimer, the term of this patent is extended or adjusted under 35 U.S.C. 154(b) by 0 days.

(21) Appl. No.: 17/835,635

(22) Filed: Jun. 8, 2022

(51) Int. Cl.
*G01D 4/00* (2006.01)
*G01R 21/00* (2006.01)
*G01D 4/10* (2006.01)

(52) U.S. Cl.
CPC ............ *G01D 4/004* (2013.01); *G01D 4/10* (2013.01); *G01R 21/003* (2013.01)

(58) Field of Classification Search
CPC ......... G01D 4/004; G01D 1/04; G01R 21/003
See application file for complete search history.

(56) References Cited

U.S. PATENT DOCUMENTS

| 9,945,889 | B2* | 4/2018 | Nikovski | ............ | G01R 22/066 |
| 2018/0025444 | A1 | 1/2018 | Steigler | | |
| 2019/0137592 | A1* | 5/2019 | Leonard | ............... | G01R 22/066 |

FOREIGN PATENT DOCUMENTS

CN   112149057 A   12/2020

OTHER PUBLICATIONS

"Abdullah LAIQ Shah, Accurate Detection And Correction Of Technical And Non-Technical Losses Using Smart Metering", May 2018, A Thesis Presented to the Deanship Of Graduate Studies King Fahd University Of Petroleum & Minerals, Dhahran, Saudi Arabia (Year: 2018).*
"Abdullah L. Shah, WEssam Mesbah, Ali T. Al-Awami, An Algorithm for Accurate Detection and Correction of Technical and Nontechnical Losses Using Smart Metering, Nov. 2020, IEEE Transactions On Instrumentation And Measurement, vol. 69, No. 11" (Year: 2020).*

(Continued)

*Primary Examiner* — Amine Benlagsir
(74) *Attorney, Agent, or Firm* — Oblon, McClelland, Maier & Neustadt, L.L.P.

(57) ABSTRACT

A method for detecting non-technical losses in an electrical power system includes measuring an area under a squared RMS current curve for a power cable in the electrical power system over at least one time interval, measuring an active and a reactive energy for the power cable over the at least one time interval, and characterizing a cable reactance and a cable resistance using the active energy, the reactive energy, and the area under the squared RMS current curve. The method further includes determining an active energy loss and a reactive energy loss over the at least one time interval using the area under the squared RMS current curve and the reactance and the resistance of the cable, and detecting a non-technical loss in the electrical power system based on the active energy loss and the reactive energy loss over the at least one time interval.

20 Claims, 22 Drawing Sheets

(56) References Cited

OTHER PUBLICATIONS

Shah ; "Accurate detection and correction of technical and non-technical losses using smart metering", King Fahd University of Petroleum & Minerals, May 2018 ; 194 Pages.
Eronu, et al. ; IoT Based Non-Technical Loss Detection and Mitigation System for Power Distribution Networks ; European Journal of Engineering and Technology Research , vol. 6, Issue 7 ; Dec. 2021 ; 7 Pages.
Shah, et al. ; An Algorithm for Accurate Detection and Correction of Technical and Nontechnical Losses Using Smart Metering ; IEEE Transactions on Instrumentation and Measurement, vol. 69, No. 11 ; Nov. 2020 ; 12 Pages.
Shah, et al. ; An Algorithm for Detaching Technical Losses from Non-Technical Losses in Distribution Systems ; IEEE Xplore 2021 ; Pages.
Shah, et al. ; Time Skew Mitigation in Smart Meters for Tampering Detection and Correction ; IEEE Transactions on Instrumentation and Measurement, vol. 70 ; 2021 ; 15 Pages.

\* cited by examiner

METHOD AND SYSTEM TO DETECT NON-TECHNICAL LOSSES IN AN ELECTRICAL POWER SYSTEM

BACKGROUND

Technical Field

The present disclosure is directed to non-technical losses in a metering system in power grids and, more particularly relates, to method and system to detect non-technical losses in an electrical power system.

Description of Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present disclosure.

One of the long-lasting challenges of metering systems in power grids has been non-technical losses (NTL). Non-technical losses occur due to unidentified, misallocated, or inaccurate energy flows. They can be thought of as electricity that is consumed but not billed. The NTL may occur due to tampering with metering units or smart meter, tapping service cables connected to the smart meter, or even a cyber attack on the smart meter.

Existing systems use advanced metering infrastructure in a smart grid that adds software and communication layers to the smart meters. The smart meters can perform two-way communication such as sending power consumption or number of units consumed by a customer to the metering infrastructure as well as receiving certain information from the metering infrastructure such as current tariff or any lucrative offers running for electricity or gas. However, with the addition of a communication layer, the metering system is prone to cyber attacks that may cause NTL. The cyber attack may alter or tamper readings of the smart meter.

In order to detect NTL in energy distribution systems using smart meters, metering data from all such smart meters need to be accurately synchronized on a common time reference clock. However, commercially available smart meters usually experience time drift or skew in their internal real-time clock (RTC) which leads to time skewed data. Inaccurate readings due to time skew can lead to an inaccurate measurement of energy consumption, thus leading to inaccurate detection and correction of NTL.

In order to address the drawbacks and weaknesses of smart meter distribution systems, the present disclosure describes a method and systems for detecting non-technical losses (NTL) in an electrical power system and its implementation in a power distribution grid.

SUMMARY

In an exemplary embodiment, the present disclosure discloses a method for detecting non-technical losses (NTL) in an electrical power system, according to an embodiment of the present disclosure. The method includes measuring an area under a squared root mean squared (RMS) current curve for a power cable in the electrical power system over at least one time interval. The method further includes measuring an active energy and a reactive energy for the power cable over the at least one time interval. The method further includes characterizing a cable reactance and a cable resistance using the active energy, the reactive energy, and the area under the squared RMS current curve. The method further includes determining an active energy loss and a reactive energy loss over the at least one time interval using the area under the squared RMS current curve, the cable reactance, and the cable resistance. The method further includes detecting a non-technical loss in the electrical power system based on the active energy loss and the reactive energy loss over the at least one time interval.

According to another embodiment of the present disclosure, a system for detecting non-technical losses (NTL) is disclosed. The system includes a power cable in an electrical power system and at least one smart meter in the electrical power system. The at least one smart meter is configured to measure an area under a squared root mean squared (RMS) current curve for the power cable over at least one time interval. The at least one smart meter is configured to measure an active energy and a reactive energy for the power cable over the at least one time interval. The at least one smart meter is configured to characterize a cable reactance and a cable resistance using the active energy, the reactive energy, and the area under the squared RMS current curve. The at least one smart meter is configured to determine an active energy loss and a reactive energy loss for the electrical power system using the area under the squared RMS current curve, the active energy, and the reactive energy. The at least one smart meter is configured to detect a non-technical loss in the electrical power system based on the active energy loss and the reactive energy loss over the at least one time interval.

The foregoing general description of the illustrative embodiments and the following detailed description thereof are merely exemplary aspects of the teachings of this disclosure, and are not restrictive.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein.

DETAILED DESCRIPTION

Figure 1:
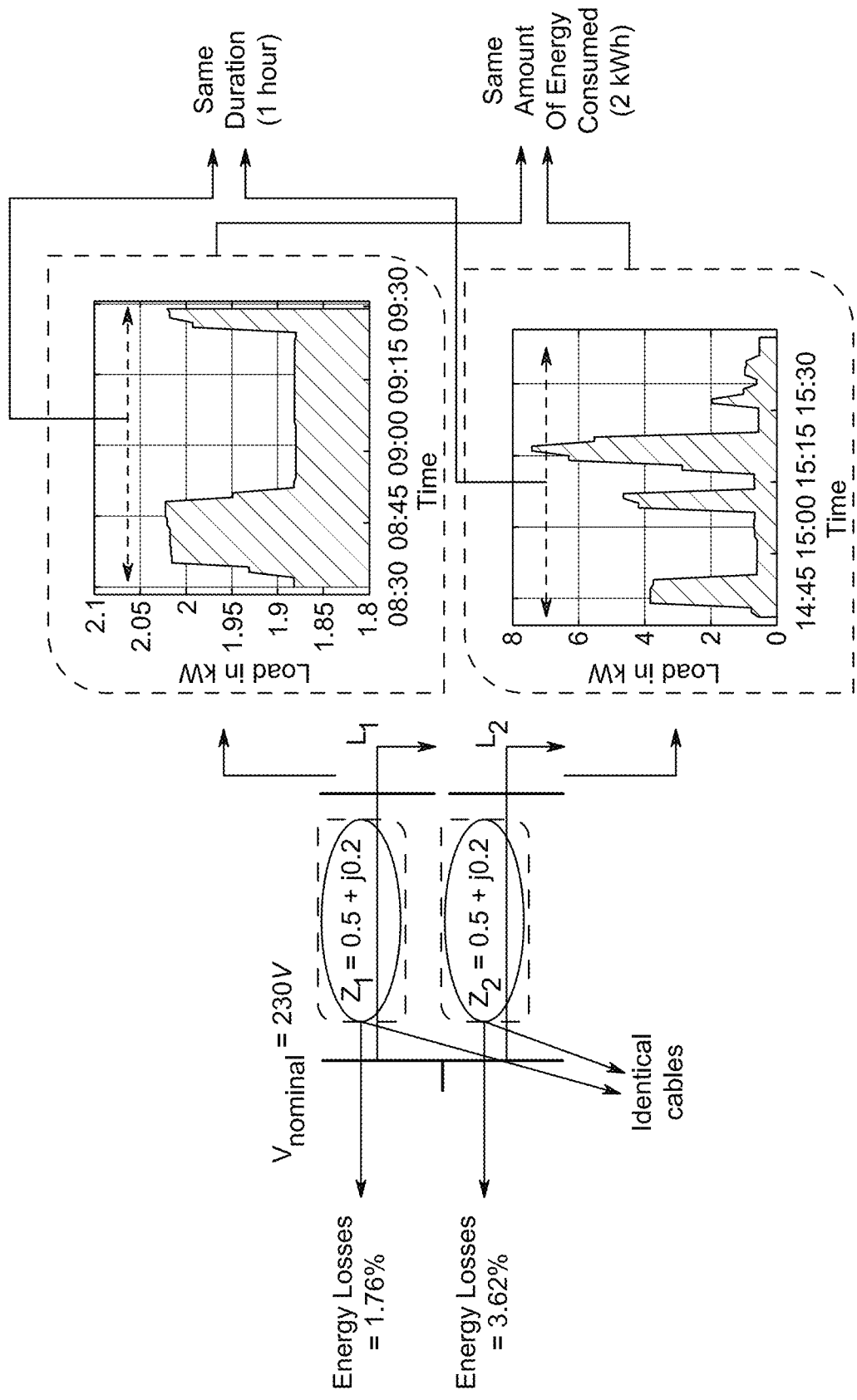
FIG. 1 illustrates an exemplary schematic diagram, as a prior art, consisting of two identical cables delivering a same amount of energy to two different loads with different energy losses, according to certain embodiments.

Reference will now be made in detail to specific embodiments or features, examples of which are illustrated in the accompanying drawings. Wherever possible, corresponding or similar reference numbers will be used throughout the drawings to refer to the same or corresponding parts. Moreover, references to various elements described herein, are made collectively or individually when there may be more than one element of the same type. However, such references are merely exemplary in nature. It may be noted that any reference to elements in the singular may also be construed to relate to the plural and vice-versa without limiting the scope of the disclosure to the exact number or type of such elements unless set forth explicitly in the appended claims.

In the drawings, like reference numerals designate identical or corresponding parts throughout the several views. Further, as used herein, the words "a," "an" and the like generally carry a meaning of "one or more," unless stated otherwise.

Furthermore, the terms "approximately," "approximate," "about," and similar terms generally refer to ranges that include the identified value within a margin of 20%, 10%, or preferably 5%, and any values therebetween.

Aspects of the present disclosure are directed to a method and system to detect non-technical losses (NTL) in an electrical power system using smart meters. Each smart meter may be configured to measure a new quantity, that is, an area under the squared root mean square (RMS) current curve for a power cable. This quantity provides an accurate measurement of energy usage that is not affected by time skew or by instantaneous changes in consumption. The smart meters may also be configured to measure an active energy and a reactive energy instead of an active power and a reactive power. Measuring the active energy, the reactive energy, and the area under the squared RMS current curve assists in identifying the cable resistance, reactance, and the losses in the cable. Accordingly, based upon the calculation of cable resistance, reactance and the losses in the cable, the methods and systems effectively identify and/or correct the NTL. The methods and systems disclosed herein nullify the effect of time skew over the measurement data of the smart meter.

Energy losses in a system can result, for example, from illegal cable tapping, cyber attack, or other tampering. FIG. 1 illustrates an example of energy loss in a system consisting of two identical cables delivering a same amount of energy to two different loads. The load may be, for example, 1 KWH on each power cable. Various exemplary parameters such as duration of the supply provided to the load, the active energy, reactive energy consumed by the loads, and cable impedance are given in Table 1.

TABLE 1

| ENERGY LOSSES IN TWO IDENTICAL CABLES | | |
|---|---|---|
| Attribute | $L_1$ | $L_2$ |
| Duration (minutes) | 60 | 60 |
| Active energy (kWh) | 2 | 2 |
| Reactive energy (kVarh) | 0.00 | 0.00 |
| Cable impedance (Ω) | 0.5 + j0.2 | 0.5 + j0.2 |
| Energy losses (Wh) | 35.13 | 72.47 |

Through experimental calculations it can be found that, though for the same duration of electricity supplied to the load with the same amount of active energy and the reactive energy consumed at the same amount of cable impedance, the energy losses in the two identical cables are different. In one example, the energy losses depend on the profile of the RMS current flowing through the cable rather than the total energy consumed by the load. Therefore, synchronized RMS current profiles are required in order to accurately determine the energy losses. These RMS current profiles can be obtained from the instantaneous current reported by phasor measurement units (PMUs), and can be used to determine the energy losses in the cables during the interval of interest. However, deploying PMUs as smart meters is expensive and impractical in a power distribution system and requires large communication bandwidths to frequently report instantaneous measurements.

It is therefore required to develop a method or a system which could calculate energy losses in cables and detect and/or correct NTL in smart meters without the need for synchronized or instantaneous smart meter measurements. In a large power system, it is also desired to develop a method or a system to detect NTL while minimizing the needed bandwidth for reporting metric data and calculating energy losses.

Figure 2A:
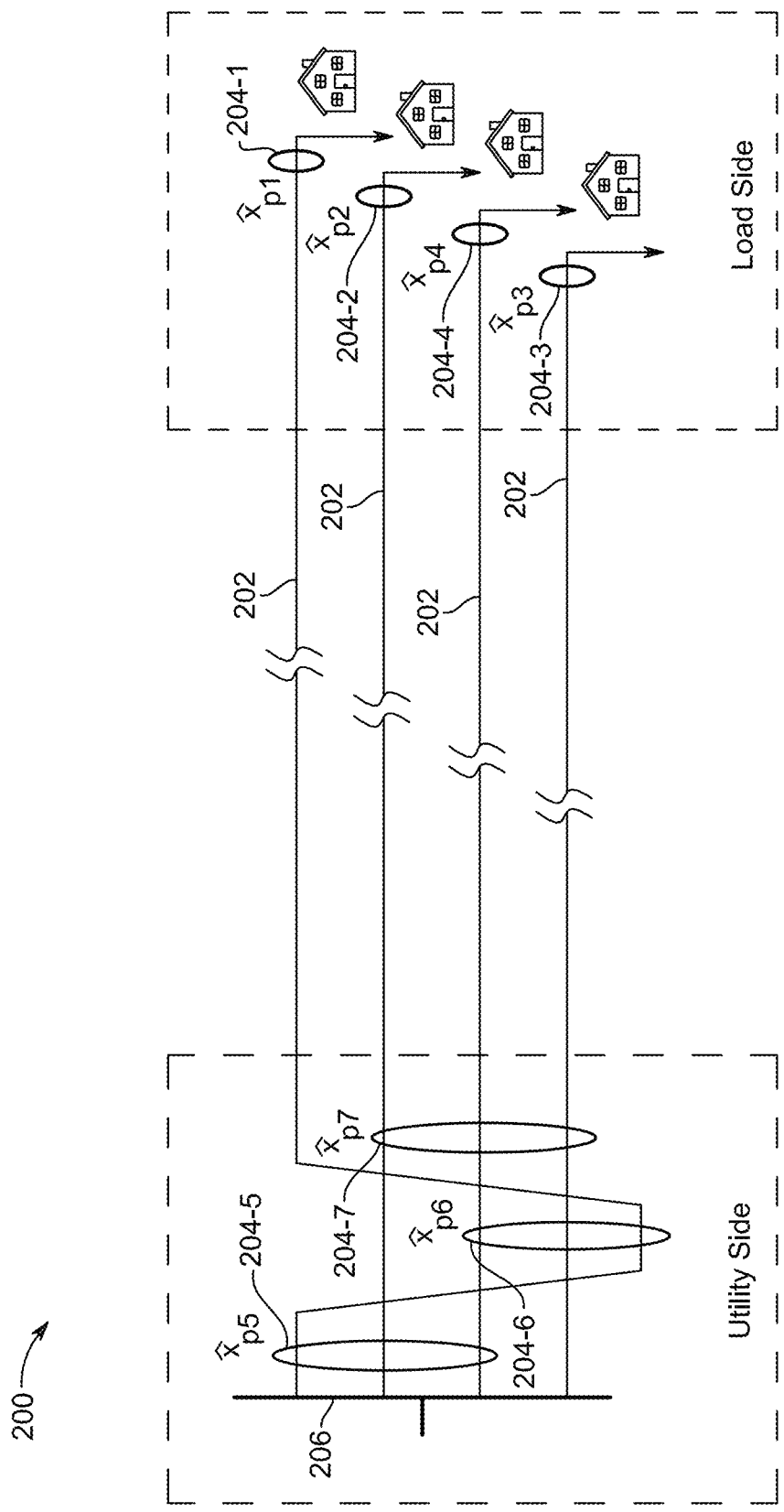
FIG. 2A is an exemplary schematic diagram of a system for detecting non-technical losses in an electrical power system, according to an embodiment.

FIG. 2A is an exemplary schematic diagram of a system 200 for detecting non-technical losses in an electrical power system. The system 200 includes a power cable 202 connected to an electrical power system and at least one smart meter 204 electrically coupled to the power cable 202 in the electrical power system. The smart meter 204 may refer to a meter or a check meter. In one embodiment, the check meter may be installed on the utility side, while the meter is installed on the consumer/load side. In one embodiment, the meters and the check meters may be in communication. In one embodiment, Hamming code and/or modified versions of the Hamming code may be used to detect and correct errors, e.g., at the utility side, as described in "An Algorithm for Accurate Detection and Correction of Technical and Nontechnical Losses Using Smart Metering," published Jun. 1, 2020, which is incorporated herein by reference in its entirety. In one embodiment, the system may include $2^M-M-1$ regular meters and M check meters. In an example, the value of M is 4. Accordingly, the exemplary system 200 illustrated in FIG. 2 includes 7 smart meters 204, where four regular smart meters 204, such as a first regular smart meter 204-1, a second regular smart meter 204-2, a third regular smart meter 204-3 and a fourth regular smart meter 204-4, are installed at the load side or consumer side, while three check meters 204, such as a first check meter 204-5, a second check meter 204-6 and a third check meter 204-7 are installed at utility side. The first regular smart meter 204-1, the second regular smart meter 204-2, the third regular smart meter 204-3 and the fourth regular smart meter 204-4 are represented as $x_{p1}$, $x_{p2}$, $x_{p3}$ and $x_{p4}$, respectively. The first check meter 204-5 may be represented as a fifth smart meter $x_{p5}$ that is electrically connected to the first regular smart meter 204-1, the second regular smart meter 204-2 and the fourth regular smart meter 204-4. The second check meter 204-6 may be represented as a sixth smart meter $x_{p6}$ that is electrically connected to the first regular smart meter 204-1, the third regular smart meter 204-3 and the fourth regular smart meter 204-4. The third check meter 204-7 may be represented as a seventh smart meter $x_{p7}$ that is electrically connected to the second regular smart meter 204-2, the third regular smart meter 204-3 and the fourth regular smart meter 204-4, respectively. In one embodiment, the check meters are connected to the regular smart meter for verification. The check meter may be installed for energy accounting and billing in case of failure of the regular meter. In an embodiment, the electrical power system 200 refers to a metering infrastructure. According to some embodiments, the electrical power system 200 may be considered a power distribution system, a distribution system, distribution line, distribution link, metric infrastructure, distribution network, or an electrical power system.

The at least one smart meter may be connected to a distribution transformer 206. The at least one smart meter 204 may be configured to detect a plurality of loads on the electrical power system. In one embodiment, the distribution transformer 206 may provide a final voltage transformation in the electric power system 200. The distribution transformer 206 may also provide a step down voltage used in the power cable 202 to the level used by the customer/load through the regular smart meter 204. In an embodiment, at least one check meter and/or at least one regular smart meter may be connected to the distribution transformer 206. According to one embodiment, at least one smart meter 204 may be configured to detect a load from a plurality of loads. In one embodiment, each of the smart meters 204 may be configured to detect the number of loads, power or energy ratings, hourly consumption, and/or related information.

Figure 2B:
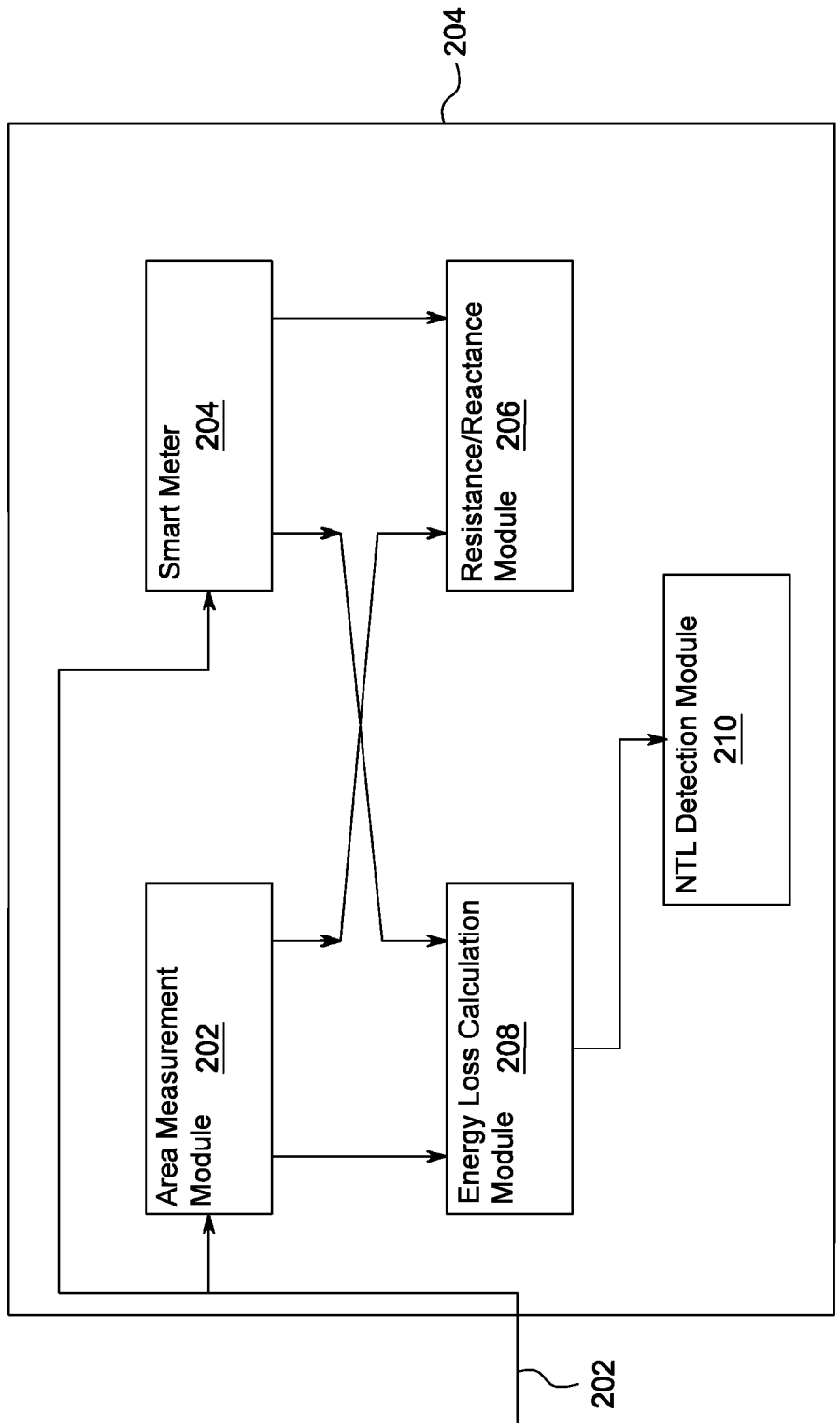
FIG. 2B illustrates a schematic diagram of a smart meter, according to certain embodiment.

FIG. 2B illustrates a schematic diagram of a smart meter 204, according to an embodiment. The smart meter 204 may include an area measurement module 202 configured to measure an area under a squared root mean square (RMS) current curve flowing through the power cable 202 in at least one time interval. In one embodiment, the area measurement module 202 may be configured to measure an area under an RMS current curve. The smart meter 204 may further include an active energy and a reactive energy measurement module 204 configured to measure a value of active energy as well as reactive energy flowing through the power cable 202 in the at least one time interval. The smart meter 204 may further include a cable resistance and reactance module 206 configured to characterize and/or calculate the impedance of the power cable 202 in the at least one time interval. The cable resistance and reactance module 206 may be in communication with the area measurement module 202 and the active energy and a reactive energy measurement module 204 to transmit values. In one embodiment, the modules may be in wireless communication, e.g., via a communication network. In one embodiment, the modules may be in wired communication. The smart meter 204 may further include an active energy loss and reactive energy loss calculation module 208. The active energy loss and reactive energy loss calculation module 208 may be in communication with the area measurement module 202 and the active energy and reactive energy measurement module 204. The smart meter 204 may further include a non-technical loss (NTL) detection module 210. The NTL detection module 210 may be in communication with the active energy loss and reactive energy loss calculation module 208. As such, based upon the active energy losses and the reactive energy losses, the smart meter 204 may be configured to detect the NTL over the power cable 202 in the at least one time interval.

In an illustrative example, the system 200 may include 4 regular meters and 3 check meters. Within the system 200, in one example, at least one check smart meter and/or at least one regular smart meter may have an error leading to non-technical loss. The error may be due to tampering, time skew, cable tapping or cyber-attack over any of the smart meters in the system 200.

When the system 200 is operational and functioning, each smart meter 204 may be configured to measure an area under a squared root mean squared (RMS) current curve for the power cable 202 over at least one time interval. The area measurement module 202 may receive and/or detect the current flowing through the power cable 202 and compute the area under the squared RMS current curve over at least one time interval. The utility and importance of measuring area under a curve instead of an instantaneous value (e.g., instantaneous voltage, current or power) is illustrated with an example in FIGS. 3A and 3B.

Figure 3A:
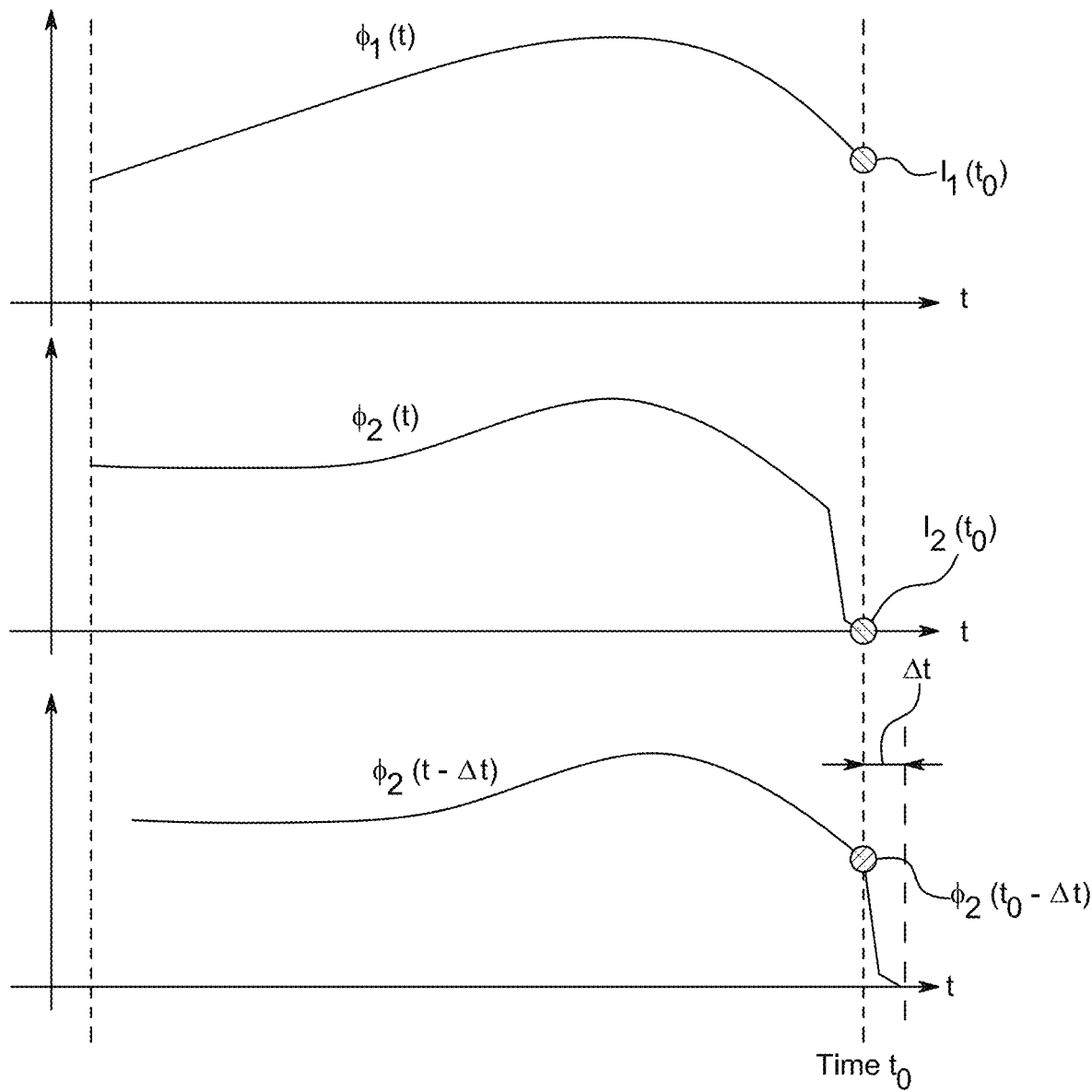
FIG. 3A illustrates a demonstration of time skew and its effect in practical scenario, according to an exemplary embodiment.

FIG. 3A illustrates a demonstration of time skew and its effect in practical scenario, according to an exemplary embodiment. In order to accurately detect and correct the errors in smart meter 204, data should be accurately synchronized on a common time reference frame during data logging. However, if the data is not synchronized to a common time reference frame, the NTL detection may fail due to the nature of the residential loads, where rapid changes occur commonly when appliances turn on and off. The effect of the rapid changes is illustrated with an example. Suppose two quantities of consumption, $\phi_1(t)$ and $\phi_2(t)$, are on a common time reference frame, while $\phi_2(t-\Delta t)$ is a time skewed version of $\phi_2(t)$. In an embodiment, the quantities $\phi_1(t)$ and $\phi_2(t)$ may refer to a voltage curve, current curve, or power curve over the power cable 202. If instantaneous values of the two quantities at to are used to calculate NTL in the power cable 202, the value $\phi_2(t_0-\Delta t)$ would be used in place of $\phi_2(t_0)$ at instant to due to the time skew $\Delta t$ of $\phi_2$. However, the difference between the actual value $\phi_2(t_0)$ and the time skewed value $\phi_2(t_0-\Delta t)$ may be very large, e.g., due to abrupt changes in loads connected to a smart meter, as can be seen in the steep decrease in $\phi_2(t)$ around to. Instantaneous values may be reported by smart meters at intervals of seconds to minutes to hours. Time skews in measurements may therefore result in inaccurately reported values for a given moment in time. The inaccurate values may cause any known NTL detection algorithms using instantaneous values to fail. The sudden changes in the instantaneous quantities represented by the curves and measured by the smart meter 204 are common in actual home profiles, where the power consumption may change abruptly due to a continuous switching of home appliances.

Figure 3B:
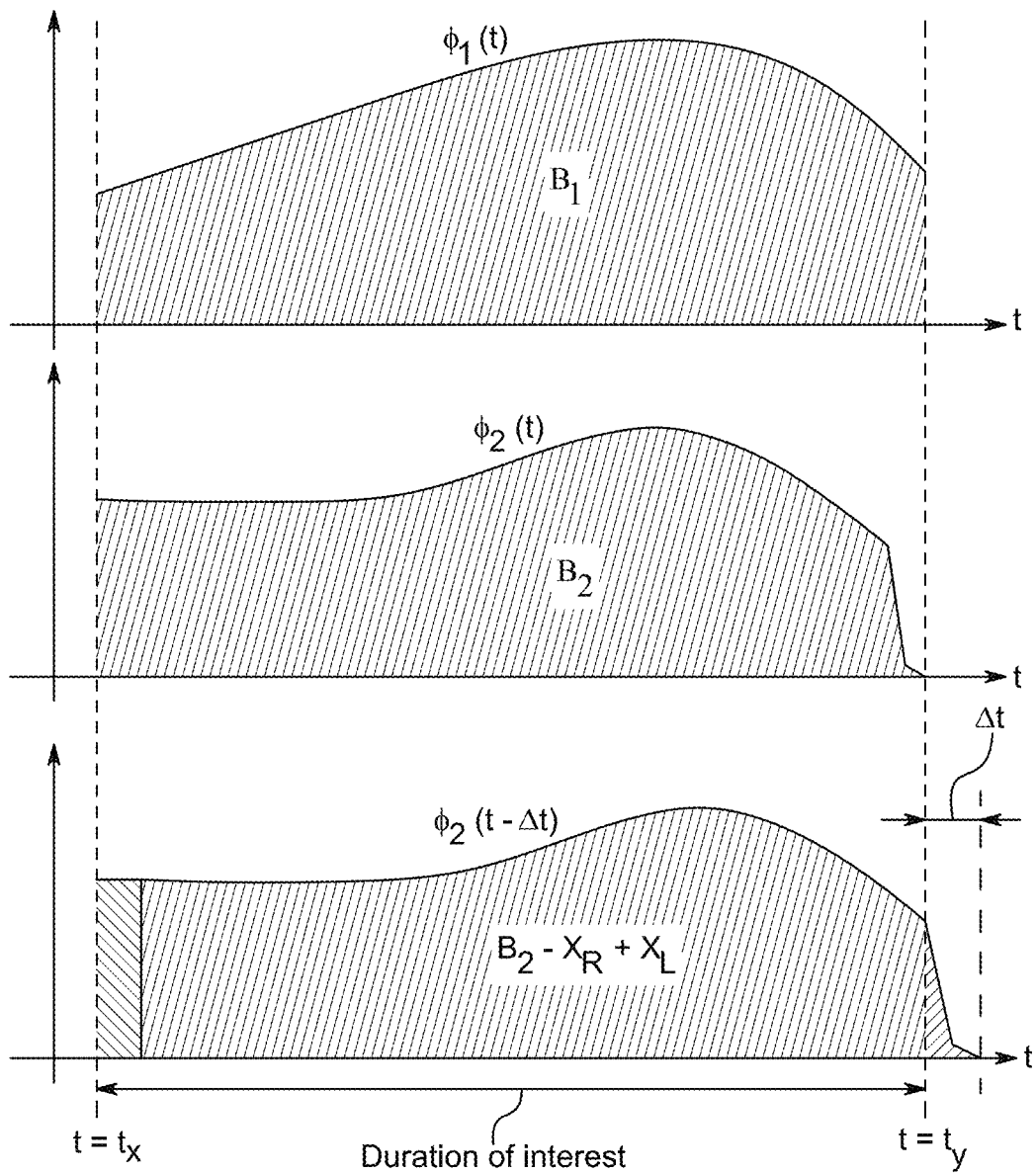
FIG. 3B illustrates a demonstration of time skew and ways to reduce its effect by using area under the curve, according to an exemplary embodiment.

FIG. 3B illustrates a demonstration of a way to reduce the effect of time skew by using the area under a curve, according to an exemplary embodiment. As discussed previously in FIG. 3A, the difference between the actual value $\phi_2(t_0)$ and the reported value $\phi_2(t_0-\Delta t)$ due to time skew may be very large, which may lead the NTL detection process to fail. In one embodiment, the method of the present invention may use the area under the curves, such as the areas $B_1$, $B_2$ to determine NTL rather than instantaneous values at a given point in time. In the illustrative example, given the time skew of $\Delta t$ between $\phi_1(t)$ and $\phi_2(t)$, the area under the quantity $\phi_1(t)$ may be used along with the area under $\phi_2(t-\Delta t)$ instead of the area under $\phi_2(t)$. For the interval of interest between $t_x$ and $t_y$, the areas under $B_1$, $B_2$, and skewed version of $B_2$ is computed for the time interval $t_x$ and $t_y$ as below:

$$B_1 = \int_{t_x}^{t_y} \phi_1(t)dt, \quad (1)$$

$$B_2 = \int_{t_x}^{t_y} \phi_2(t)dt, \quad (2)$$

$$B_2 - X_R + X_L = \int_{t_x}^{t_y} \phi_2(t - \Delta t)dt, \quad (3)$$

where $B_1$ and $B_2$ are the areas under $\phi_1(t)$ and $\phi_2(t)$, respectively during the interval $t_x$ and $t_y$ and $(X_L - X_R)$ is the error in the area under $\phi_2(t)$ due to time skew $\Delta t$.

Now, the relative error due to the time skew $\Delta t$ for both cases are calculated as:

$$\epsilon_{\phi_2(t_o)} = \left| \frac{(\phi_2(t_o) - (\phi_2(t_o - \Delta t))}{\phi_2(t_o)} \right|, \quad (4)$$

$$\epsilon_{B_2} = \left| \frac{B_2 - X_R + X_L}{B_2} \right| = \left| \frac{X_L - X_R}{B_2} \right|, \quad (5)$$

where $\epsilon_{\phi_2(t_o)}$, is the relative error in the quantity $\phi_2(t_0)$ due to time skew $\Delta t$, and $\epsilon_{B_2}$ is the relative error in the quantity $B_2$ due to time skew $\Delta t$.

It is clear from equations 4 and 5 that $\epsilon_{B_2}$ is less than $\epsilon_{\phi_2(t_o)}$, and accordingly percentage error $\epsilon_{B2}$ decreases as the value of $B_2$ increases by increasing the time duration or one time interval ($t_y-t_x$). Therefore, using areas under the curves instead of instantaneous values to determine loss reduces the relative error due to time skew of the smart meters 204. As such, the smart meter 204 may be configured to measure the area under the curve instead of instantaneous value.

In one embodiment, the curves may represent an energy curve instead of a power curve. Accordingly, the effect of the time skew is minimized, and the smart meter 204 can report energy consumed during a specific time interval. Reporting energy consumption over time rather than multiple measurements of power over a time interval can reduce required communication bandwidth for characterizing an electrical power system.

In a preferred embodiment, the curves are squared root mean square (RMS) values of a current flowing through the power cable 202. As the losses in the power cables 202 depend upon the profile of RMS current flowing through the power cable 202 rather than the energy consumed by the load side, the smart meter 204 may be configured to measure the area under a squared root mean squared (RMS) current curve for the power cable 202 over at least one time interval, for example, ($t_y-t_x$). Accordingly, the area measurement module 202 may be configured to measure the area A(k) under a squared RMS current curve for the duration ($t_y-t_x$) time interval as below:

$$A(k) = \int_{t_1}^{t_2} I_{rms}^2(t)dt, \quad (6)$$

Referring back to FIG. 2B., once the smart meter 204 computes the area A(k) under the squared RMS current curve for the duration ($t_y-t_x$), the smart meter 204 may further be configured to measure an active energy and a reactive energy for the power cable 202 over the same time interval ($t_y-t_x$) as the area A(k). The active energy and a reactive energy measurement module 204 of the smart meter 204 may be configured to determine the active energy and reactive energy running over the power cable 202 for the time interval ($t_y-t_x$) rather than active power or reactive power, which are instantaneous rates. Active energy losses over a cable can be calculated as a function of the area A(k) and the resistance of the cable. Reactive energy losses over a cable can be calculated as a function of the area A(k) and reactance of the cable. It has been shown that cable impedances may be characterized as a function of instantaneous power measured by smart meters attached to the cables and instantaneous current through the cables. However, measurements of instantaneous power and current are susceptible to error due to time skew between smart meters. Therefore, a preferred embodiment of the present invention may use the area A(k) and energy consumption over a time interval as reported by smart meters to develop a new system of equations for characterizing cable impedance. Using the area A(k) and energy rather than instantaneous power eliminates the need for smart meters to be synchronized and thus eliminates the adverse impact of time skew between smart meters in accurately characterizing cable impedances. Notably, in a preferred embodiment, the present invention may use a plurality of equations, e.g., M independent equations for a system that has M check meters, for estimating cable resistance and a plurality of equations, e.g., M independent equations for a system that has M check meters, for estimating cable reactance. Using a plurality of equations enables the system of the present invention to estimate resistance and reactance using fewer time intervals.

An example of energy measurement by the smart meters 204 is presented. Each smart meter 204 may be configured to measure active energy and a reactive energy for the same time interval ($t_y$-$t_x$). Accordingly, there are multiple equations of active energy in the power distribution system 200, as in the non-limiting example embodiment presented below:

$$E_{p5}(k) - E_{p1}(k) - E_{p2}(k) - E_{p4}(k) = \frac{R_1 A_1(k)}{\alpha} + \frac{R_2 A_2(k)}{\alpha} + \frac{R_4 A_4(k)}{\alpha}, \quad (7)$$

$$E_{p6}(k) - E_{p1}(k) - E_{p3}(k) - E_{p4}(k) = \frac{R_1 A_1(k)}{\alpha} + \frac{R_3 A_3(k)}{\alpha} + \frac{R_4 A_4(k)}{\alpha},$$

$$E_{p7}(k) - E_{p2}(k) - E_{p3}(k) - E_{p4}(k) = \frac{R_2 A_2(k)}{\alpha} + \frac{R_3 A_3(k)}{\alpha} + \frac{R_4 A_4(k)}{\alpha},$$

where, $R_1$, $R_2$, $R_3$, $R_4$ are the values of the resistances of the power cable 202, respectively;

$A_1(k)$, $A_2(k)$, $A_3(k)$, $A_4(k)$ are the area under the RMS current curve measured by each regular smart meter 204 as given in equation 6;

$\alpha$ is a conversion constant (e.g., 60×60); and $E_{pn}(k)$ is the active energy measured by $n^{th}$ smart meter 204 during $K^{th}$ interval in the electrical power system wherein n=1, 2, 3, 4, 5, 6, 7 (e.g., 4 regular meters and 3 check meters in the power distribution system 200).

Similarly, there are multiple equations of reactive energy in the power distribution system 200 as below:

$$E_{q5}(k) - E_{q1}(k) - E_{q2}(k) - E_{q4}(k) = \frac{X_1 A_1(k)}{\alpha} + \frac{X_2 A_2(k)}{\alpha} + \frac{X_4 A_4(k)}{\alpha}, \quad (8)$$

$$E_{q6}(k) - E_{q1}(k) - E_{q3}(k) - E_{q4}(k) = \frac{X_1 A_1(k)}{\alpha} + \frac{X_3 A_3(k)}{\alpha} + \frac{X_4 A_4(k)}{\alpha},$$

$$E_{q7}(k) - E_{q2}(k) - E_{q3}(k) - E_{q4}(k) = \frac{X_2 A_2(k)}{\alpha} + \frac{X_3 A_3(k)}{\alpha} + \frac{X_4 A_4(k)}{\alpha},$$

where, $X_1$, $X_2$, $X_3$, $X_4$ are the values of the reactance of the power cable 202, respectively;

$A_1(k)$, $A_2(k)$, $A_3(k)$, $A_4(k)$ are the area under the RMS current curve measured by each regular smart meter 204 as given in equation 6;

$E_{qn}(k)$ is the reactive energy measured by $n^{th}$ smart meter 204 during $K^{th}$ interval in the power distribution system 200 (where n=1, 2, 3, 4, 5, 6, 7).

While the above equations have been included as an illustrative example, the systems and methods of the present disclosure for characterizing the energy measured can be applied to a power system with any number of cables and check meters. In one embodiment, a power system with at least 2 check meters can be characterized using the active energy and reactive energy equations described in the present disclosure. In one embodiment, the number of regular meters N that can be checked by M check meters in a system can be defined as $N \leq 2^M - M - 1$. Advantageously, the exponential term enables the equations to be applied to a large number of regular meters. For example, a system with 10 check meters can be used to monitor up to 1013 regular meters for non-technical losses.

According to one embodiment, the configuration of check meters and the equations for active and reactive energy can be determined systematically for any system with M check meters and N regular meters. The configuration of check meters can include the connections between the check meters and the cables of the system and the energy measured by each check meter. In one embodiment, the number of check meters M can be used to define a configuration matrix H of dimensions N×M, wherein the matrix H can be used to define a check meter configuration table. The steps for determining the matrix H according to one embodiment are described herein.

First, a list of the binary numbers with bit depth M starting from 1 can be determined. For example, in a system with 3 check meters, the list can include (001, 010, 011, 100, 101, 110, 111). The first number in the list is 1 and the last number in the list is the largest number that can be made with M bits, or $2^M - 1$. The binary numbers that only include one 1 can be removed. In the illustrative example, the numbers (001, 010, 100) can be removed from the list. The resulting list (011, 101, 110, 111) has 4 entries, which is the number of regular meters N that can be monitored by the check meters according to the equation $N \leq 2^M - M - 1$.

In one embodiment, the matrix $H^h$ can be defined as the remaining binary numbers in the list:

$$H^h_{4 \times 3} = \begin{pmatrix} 0 & 1 & 1 \\ 1 & 0 & 1 \\ 1 & 1 & 0 \\ 1 & 1 & 1 \end{pmatrix}$$

In one embodiment, the matrix H for defining the configuration of check meters can be determined by flipping the matrix $H^h$ horizontally. Flipping the matrix $H^h$ horizontally reverses the rows of the matrix, resulting in the columns flipping symmetrically across a central column or axis of the matrix. In the illustrative example, the matrix H can thus be defined as:

$$H = \begin{pmatrix} 1 & 1 & 0 \\ 1 & 0 & 1 \\ 0 & 1 & 1 \\ 1 & 1 & 1 \end{pmatrix}$$

The check meter configuration table can be generated based on the matrix H given that the meters are numbered with the regular meters followed by the check meters. Each row of the matrix can be associated with a regular meter from Meter 1 to Meter N. Each column of the matrix is associated with a check meter from Meter N+1 to Meter N+M. Thus, the following check meter configuration table can be generated based on the illustrative matrix H:

|         | Meter 5 | Meter 6 | Meter 7 |
|---------|---------|---------|---------|
| Meter 1 | 1       | 1       | 0       |
| Meter 2 | 1       | 0       | 1       |
| Meter 3 | 0       | 1       | 1       |
| Meter 4 | 1       | 1       | 1       |

Wherein Meters 1-4 are the regular meters and Meters 5-7 are the check meters. The check meter configuration table can be interpreted as follows: Meter 5 is configured to measure the energy flowing into cables associated with Meter 1, Meter 2, and Meter 4; Meter 6 is configured to measure the energy flowing into cables associated with Meter 1, Meter 3, and Meter 4; Meter 7 is configured to measure the energy flowing into cables associated with Meters 2-4.

The set of equations for active energy and reactive energy can thus be constructed using the check meter configuration table. The energy measured by a check meter (e.g., Meter 5) can be defined as the sum of the energies measured by each of the associated regular meters (e.g., Meter 1, Meter 2, and Meter 4) and the energy losses of the associated cables (e.g., Cable 1, Cable 2, and Cable 4) for each of the meters. Therefore, the energy measured by Meter 5 in the illustrative example can be defined as:

$$E_{p5}(k) = E_{p1}(k) + E_{p2}(k) + E_{p4}(k) + \frac{R_1 A_1(k)}{\alpha} + \frac{R_2 A_2(k)}{\alpha} + \frac{R_4 A_4(k)}{\alpha}$$

Which can be rewritten as:

$$E_{p5}(k) - E_{p1}(k) - E_{p2}(k) - E_{p4}(k) = \frac{R_1 A_1(k)}{\alpha} + \frac{R_2 A_2(k)}{\alpha} + \frac{R_4 A_4(k)}{\alpha}$$

The equations for active energy measured by each check meter can thus be determined using the check meter configuration table. The corresponding equations for reactive energy measured by each check meter can also be determined using the check meter configuration table. In one embodiment, the process for determining energy measured by each check meter can be applied to any system having M check meters and N regular meters, where $N=2^M-M-1$. In one embodiment, the process for determining energy measured by each check meter can be applied to a system having M check meters and N regular meters, where $N \leq 2^M-M-1$.

Accordingly, the active energy and a reactive energy measurement module 204 of each smart meter 204 measures $E_{pn}(k)$ as well as $E_{qn}(k)$ for at least one time interval $(t_y-t_x)$. This measurement is further used in calculating the resistance and reactance of the power cable 202. In an embodiment, while performing any such the measurements, the at least one time interval may include overlapping time intervals. In one embodiment, the at least one time interval may include time intervals determined by a moving window. In another embodiment, the least one time interval may include separate and non-overlapping time intervals. The details and advantage of using either type of time intervals during the measurement are well illustrated with reference to FIGS. 4A and 4B.

Figure 4A:
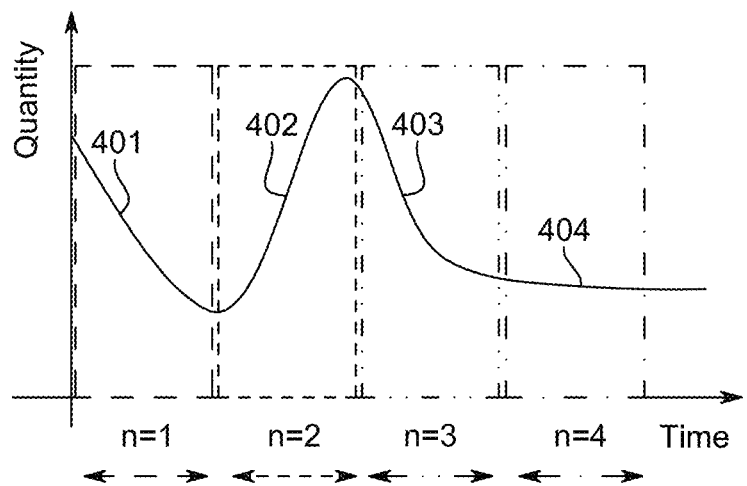
FIG. 4A illustrates a time window for measuring area under root mean square (RMS) value of current curve, active and reactive energy in a power cable wherein the time window is a separate time window, according to certain embodiments.

FIG. 4A illustrates a time window for measuring an area under a squared RMS current curve, active and reactive energy in the power cable 202 when the time window is a separate time window, according to some embodiments. The time window includes a plurality of separate time windows dividing the squared RMS current curve into a first curve 401 in n=1, a second curve 402 in n=2, a third curve 403 in n=3, a fourth curve 404 in n=4, etc. Each smart meter 204 is configured to calculate quantities such as the area under the squared RMS current curve in each time window, that is, n=1, 2, 3, 4 . . . . When the at least one time interval is a separate time interval, the first time interval n=1, for example, may correspond to the time interval $(t_y-t_x)$, the second time interval n=2 may correspond to $(t_z-t_y)$, the third time interval n=3 may correspond to $(t_{z1}-t_z)$, and so on. Accordingly, each smart meter 204 may be configured to perform the measurements using a plurality of time intervals wherein the plurality of time intervals may be the separate time intervals. In an embodiment, the duration of the time window that is, value of n, or the time interval itself can be manually or automatically adjusted in the smart meters 204. Using non-overlapping time windows may reduce computational complexity and required communication bandwidth.

Figure 4B:
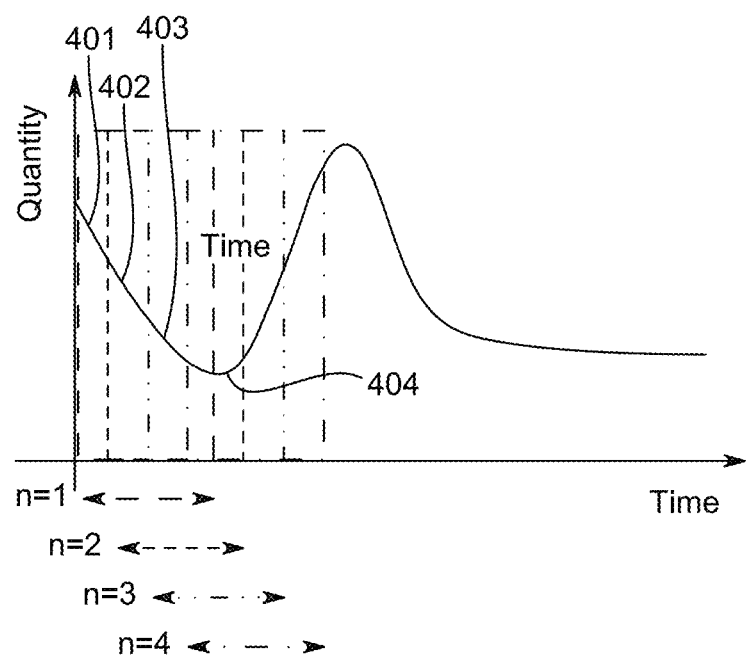
FIG. 4B illustrates a time window for measuring area under RMS current curve, active and reactive energy in the power cable where the time window is a moving time window or an overlapping time window, according to certain embodiments.

FIG. 4B illustrates a time window for measuring area under a squared RMS current curve, when the time window is a moving time window or an overlapping time window, according to one embodiment. The time window curve includes a plurality of overlapping time windows dividing the squared RMS current curve into a first curve 401 in n=1, a second curve 402 in n=2, a third curve 403 in n=3, a fourth curve 404 in n=4 etc. as overlapping curves. In the moving time window, the first time interval and the second time interval overlap by a specific time period or by some portion. The duration of the overlap and each time window can again be manually or automatically adjusted in the smart meters 204, such as 5 seconds. Now, the first time interval that is n=1 may correspond to $(t_0-t_4)$ seconds in between 0 to 4 seconds. The second time interval that is n=2 may correspond to $(t_1-t_5)$ seconds in between 1 to 5 seconds. The third time interval that is n=3 may correspond to $(t_2-t_6)$ in between 2 to 6 seconds. The first time interval and the second time interval may overlap in between $(t_1-t_4)$ that is in between 1-4 seconds. Similarly, the first, second and the third time interval may overlap in between $(t_2-t_4)$ that is 2-4 seconds. Also, the first, second, third and the fourth time interval that is n=4 may overlap in between $(t_3-t_4)$ that is 3-4 seconds. Accordingly, each consecutive time interval overlaps with its neighboring time intervals for a specific duration or overlapping portion. In an embodiment, the overlapping portion may be automatically or manually adjusted based upon the availability of the communication bandwidth. In another embodiment, the length or duration of the time window that is n, can also be manually or automatically adjusted based upon the availability of communication bandwidth. Larger overlap between time windows results in more data values and may result in more accurate calculation of active energy and reactive energy. However, larger overlap may also require larger communication bandwidth to transmit values. In one embodiment, the system may optimize the overlap between windows based on available communication bandwidth and/or desired accuracy. For example, each smart meter 204 may be configured to automatically select the value of n or the overlapping portion based upon an optimization of accuracy and/or the available communication bandwidth for reporting consumed electricity.

Referring back again to FIG. 2A, the smart meter 204 may be further configured to characterize a cable reactance and a cable resistance using the active energy, the reactive energy, and the area under the squared RMS current curve. In an embodiment, at least one smart meter 204 may be configured to characterize the cable reactance and the cable resistance using a plurality of independent equations for the at least one time interval. For example, equation 7 and 8 are functions of active energy, reactive energy, and the area under the curve of squared RMS current. Each of the smart meters 204 may include the cable resistance and reactance module 206. The cable reactance and reactance module 206 may characterize the cable reactance and the cable resistance based upon these parameters. The cable resistance and reactance module 206 may be configured to solve the equations 7 and 8 for the at least one time interval (e.g., $t_y-t_x$) to determine the cable resistance and reactance.

The left side of equations 7 and 8 represent a measurement of active energy and reactive energy as determined by at least one smart meter 204 in the power distribution system 200. The at least one smart meter may be a check smart meter or a regular smart meter. The active energy and reactive energy in the power system can be represented as a function of the resistance and reactance of cables in the system and the area under the squared RMS current curve for the cables in the system. A system with multiple cables and smart meters can thus be characterized using a system of equations. In one embodiment, the cable resistance and reactance module 206 may solve these multiple equations using at least one time interval, in order to compute the exact value of the resistance as well as reactance of each power cable 202. Accordingly, the resistance and reactance of the power cable 202 may be determined by the smart meter 204. In an embodiment, the cable resistance and reactance module 206 may utilize a least squares method (LSM) to solve the system of equations and obtain the value of cable resistance and cable reactance of the power cable 202. In an embodiment, the LSM method may be utilized to eliminate noise, e.g., random noise. In one embodiment, the equations may be solved using a coding-based method, as described in "Time Skew Mitigation in Smart Meters for Tampering Detection and Correction," published in October 2021, which is incorporated herein by reference in its entirety.

The smart meter 204 may be further configured to determine an active energy loss and a reactive energy loss using the area under the squared RMS current curve, the active energy, and the reactive energy. The active energy loss and a reactive energy loss calculation module 208 may compute an area under the squared RMS current curve, the active energy, and the reactive energy to compute the active energy losses and the reactive energy losses in the power cable 202. For example, as described earlier in equation 6, the area under the squared RMS current curve for a power cable 202 is given by $$A(k) = \int_{t_1}^{t_2} I_{rms}^2(t)dt, \tag{7}$$

Active energy losses ($E_{PL}$) in Watt-hour (Wh) for a $k^{th}$ interval (for example $t_y-t_x$) may be calculated as:

$$E_{PL}(k) = \frac{1}{\alpha}\int_{t_x}^{t_y} I_{rms}^2(t) \times R \ dt, \tag{9}$$

The area under the squared RMS current curve is determined by the smart meter 204 and unknown resistance 'R' is also determined by solving the equations 7 and 8 using the cable resistance and reactance module 206. Thus, the value of R and the area under the squared RMS current can yield the value of active energy loss in the power cable 202.

Solving the system of equations in (7) may yield the value of resistances R for each the power cable 202. that is $R_1$ for the first power cable 202, $R_2$ for the second power cable 202, $R_3$ for the third power cable 202 and $R_4$ for the fourth power cable 202.

Using equation 7, the value of resistances R for each the power cable 202 is computed. Accordingly, the active energy loss in the respective power cable 202 may be computed using equation 10 as below:

$$E_{PL}(k) = \frac{A(k) \times R}{a}, \tag{10}$$

Similarly, the reactive energy losses in Var-hour (Varh) at $k^{th}$ interval (for example, $t_x-t_y$) may also be calculated by a smart meter as $$E_{q_L}(k) = \frac{1}{\alpha}\int_{t_x}^{t_y} I_{rms}^2(t) \times X \ dt, \tag{11}$$

The value of reactance $x_1$, $x_2$, $x_3$ and $x_4$ of the power cable 202 is computed by the cable resistance and reactance module 206, using the system of equations in (8) as previously described for at least one time interval. Solving the equation 8 yields the value of reactance of the power cable 202. The reactive energy loss may thus be computed by the equation 12 as below $$E_{q_L}(k) = \frac{A(k) \times X}{\alpha}, \tag{12}$$

where the value of X for each cable is computed by the equation (8) using at least one time interval. The computed value of X is used in equation 12 in order to find the reactive energy loss in each power cable 202.

Advantageously, the active energy loss and reactive energy loss calculation module 208 may compute active energy loss and the reactive energy loss in each power cable 202 even if the measurements are sent by each smart meter 204 at a low frequency (e.g., every hour, every 6 hours, every 24 hours). Time skew within the period between measurements does not affect the calculation of active energy loss and reactive energy loss because of the use of the area under the squared RMS current curve. Advantageously, low frequency communication may reduce bandwidth requirements by not requiring an instantaneous power measurement for calculation of energy losses.

Once the active energy loss and reactive energy loss calculation module 208 computes the loss in respective power cables 202, the smart meters 204 may be configured to detect NTL in the electrical power system 200 based on the active energy loss and the reactive energy loss over the at least one time interval (e.g., $t_y-t_x$). In one embodiment, the NTL detection module 210 may be configured to compute the non-technical losses in the power cable 202, based upon active energy loss and the reactive energy loss.

In one embodiment, the NTL detection module 210 may initially define a syndrome vector for the active energy of each interval as in the exemplary embodiment below:

$$\tilde{s}_{Ep}=[\tilde{s}_{Ep1} \ \tilde{s}_{Ep2} \ \tilde{s}_{Ep3}]=(\hat{E}_p+\hat{E}_{PL})\cdot D, \tag{8}$$

Where, $\tilde{s}_{Ep}$ is the active energy measurement syndrome vector;

$\hat{E}_p$ is the vector of active energy measurements of each smart meter 204 in the distribution network;

$\hat{E}_{PL}$ is a vector of active energy losses = (14)

$$\left[\frac{R_1A_1}{\alpha}, \frac{R_2A_2}{\alpha}, \frac{R_3A_3}{\alpha}, \frac{R_4A_4}{\alpha}, 0, 0, 0\right],$$

Where, $R_1, R_2, R_3, R_4$ are power cable resistances of each power cable 202;

$A_1, A_2, A_3, A_4$ are the area under the squared RMS current in each power cable 202; and an exemplary embodiment of the decoding matrix D is shown below:

$$D = \begin{pmatrix} 1 & 1 & 0 & 1 & -1 & 0 & 0 \\ 1 & 0 & 1 & 1 & 0 & -1 & 0 \\ 0 & 1 & 1 & 1 & 0 & 0 & -1 \end{pmatrix}^T. \quad (9)$$

Similarly, the NTL detection module 210 may also define a syndrome vector for the reactive energy of each interval as in the exemplary embodiment below:

$$\tilde{s}_{Eq} = [\tilde{s}_{Eq1}\ \tilde{s}_{Eq2}\ \tilde{s}_{Eq3}] = (\hat{E}_q + \hat{E}_{QL}) \cdot D, \quad (106)$$

where, $\tilde{s}_{Eq}$ is the reactive energy measurement syndrome vector;

$\hat{E}_q$ is the vector of reactive energy measurements of each smart meter 204 in the distribution network;

$\hat{E}_{QL}$ is a vector of reactive energy losses = (17)

$$\left[\frac{X_1A_1}{a}, \frac{X_2A_2}{a}, \frac{X_3A_3}{a}, \frac{X_4A_4}{a}, 0, 0, 0\right],$$

Where, $X_1, X_2, X_3, X_4$ are power cable reactances of each power cable 202;

$A_1, A_2, A_3, A_4$ are the area under the squared RMS current in each power cable 202; and D is the decoding matrix, also described earlier, as shown below:

$$D = \begin{pmatrix} 1 & 1 & 0 & 1 & -1 & 0 & 0 \\ 1 & 0 & 1 & 1 & 0 & -1 & 0 \\ 0 & 1 & 1 & 1 & 0 & 0 & -1 \end{pmatrix}^T. \quad (15)$$

While an illustrative example is presented above, it can be appreciated that a decoding matrix D can be designed for any system with M check meters and N regular meters. In one embodiment, the decoding matrix can be designed using Hamming code. In one embodiment, the decoding matrix can be designed for any system with M check meters and N regular meters where $N = 2^M - M - 1$. In one embodiment, the decoding matrix can be determined based on the configuration matrix H used to generate the check meter configuration table. The decoding matrix can be defined as:

$$D = (H_{N \times M} | -I_{N \times N})^T$$

Wherein $I_{N \times N}$ is a square identity matrix. According to one embodiment, the syndrome vector can be determined by multiplying the smart meter measurements by the decoding matrix D. The syndrome vector can thus be a vector of length M, wherein M is the number of check meters in the system.

There may be various sources of NTL in the power cable 202 or the smart meter 204. The NTL may occur due to plurality of possibilities including, but not limited to, tampering, cable tapping, or cyber-attack over any smart meter 204 in the power distribution system 200. As such, the NTL detection module 210 may detect the possibility of each type of NTL using the syndrome vector for the active energy and the reactive energy at each interval.

In an exemplary embodiment, the NTL detection module 210 may be configured to consider possible sources of NTL. When the power distribution system 200 is free from error, the syndrome vector is a zero vector. In an embodiment, the value of the syndrome vector may be communicated to a remote power station (not shown) on a timely basis wherein the remote station displays or plots the graphical value of syndrome vector for analyzing the error, if any. The use of the syndrome vector in the present invention to determine a presence and source of NTL in exemplary embodiments is described herein.

(1) When No Meter Contains Error

When there is no error in the smart meter 204 in the power distribution system, the measured values are equal to the actual values. As such, the values of vector $\hat{E}_{PL}$ and $\hat{E}_{QL}$ should be correct for each meter in the power distribution system.

In such a case, $$\hat{E}_p = E_p, \text{ and } \hat{E}_q = E_q, \quad (11)$$

And, $$\hat{E}_{PL} = E_{PL}, \text{ and } \hat{E}_{QL} = E_{QL}, \quad (19)$$

where, $\hat{E}_p$ and $\hat{E}_q$ are vectors of active and reactive energy measured by each smart meter 204 in the power distribution system 200;

$E_p$ and $E_q$ are vectors of the actual or correct energy that are supposed to be measured by each smart meter 204 in the distribution network; and $E_{PL}$ and $E_{QL}$ are vectors of actual active and reactive energy losses.

Accordingly, if no meter has error in it, the vectors of actual energy and the measured energy are identical. Similarly, vectors of actual energy loss and the measured energy loss should be identical. The syndrome vector is thus a zero vector, as shown in equation 20 and 21 below:

$$\tilde{s}_{Ep} = E_p \cdot D + E_{PL} \cdot D = \begin{pmatrix} E_{p1} \\ E_{p2} \\ E_{p3} \\ E_{p4} \\ E_{p5} \\ E_{p6} \\ E_{p7} \end{pmatrix}^T D + \begin{pmatrix} \frac{R_1A_1}{\alpha} \\ \frac{R_2A_2}{\alpha} \\ \frac{R_3A_3}{\alpha} \\ \frac{R_4A_4}{\alpha} \\ 0 \\ 0 \\ 0 \end{pmatrix}^T \cdot D = \quad (20)$$

$$\begin{pmatrix} E_{p1} + E_{p2} + E_{p4} - E_{p5} + \frac{R_1A_1}{\alpha} + \frac{R_2A_2}{\alpha} + \frac{R_4A_4}{\alpha} \\ E_{p1} + E_{p3} + E_{p4} - E_{p6} + \frac{R_1A_1}{\alpha} + \frac{R_3A_3}{\alpha} + \frac{R_4A_4}{\alpha} \\ E_{p2} + E_{p3} + E_{p4} - E_{p7} + \frac{R_2A_2}{\alpha} + \frac{R_3A_3}{\alpha} + \frac{R_4A_4}{\alpha} \end{pmatrix} = [0\ 0\ 0]$$

And, $$\tilde{s}_{EQ} = E_Q \cdot D + E_{QL} \cdot D = \begin{pmatrix} E_{q1} \\ E_{q2} \\ E_{q3} \\ E_{q4} \\ E_{q5} \\ E_{q6} \\ E_{q7} \end{pmatrix}^T D + \begin{pmatrix} \frac{X_1 A_1}{\alpha} \\ \frac{X_2 A_2}{\alpha} \\ \frac{X_3 A_3}{\alpha} \\ \frac{X_4 A_4}{\alpha} \\ 0 \\ 0 \\ 0 \end{pmatrix}^T \cdot D = \quad (21)$$

$$\begin{pmatrix} E_{q1} + E_{q2} + E_{q4} - E_{q5} + \frac{X_1 A_1}{\alpha} + \frac{X_2 A_2}{\alpha} + \frac{X_4 A_4}{\alpha} \\ E_{q1} + E_{q3} + E_{q4} - E_{q6} + \frac{X_1 A_1}{\alpha} + \frac{X_3 A_3}{\alpha} + \frac{X_4 A_4}{\alpha} \\ E_{q2} + E_{q3} + E_{q4} - E_{q7} + \frac{X_2 A_2}{\alpha} + \frac{X_3 A_3}{\alpha} + \frac{X_4 A_4}{\alpha} \end{pmatrix} = [0 \; 0 \; 0]$$

Accordingly, if all elements of the syndrome vector are equal to zero, the NTL detection module 210 may confirm that the there are no meters with measurement errors.

(2) When a Check Meter Contains Error

In another exemplary embodiment, a smart meter 204 such as a check smart meter may have measurement error, e.g., due to either tampering, time skew, cable tapping or cyber-attack in the power distribution network. The NTL detection module 210 may calculate the value of the syndrome vector. In one embodiment, a syndrome vector with a single non-zero term can signify that the error is in a check meter. The check meter location of the error can be the index of the non-zero term in the syndrome vector. For example, an error term in the second term of the syndrome vector can indicate an error at the second check meter in the system. In an embodiment, the value of the syndrome vector may be communicated to a remote power station (not shown) on a timely basis wherein the remote station displays or plots the graphical value of syndrome vector for analyzing the error in the check meter.

The NTL detection module 210 may calculate the vectors of active and reactive energy losses based on the measurements of the regular smart meter 204. The vectors of active and reactive energy measurements may not be correct for the check meters 204 as the check meter 204 contains error. In one embodiment, if the error is isolated to the check meters, the measurements of active and reactive energy losses may not include error as the active and reactive energy losses are measured by regular smart meters. The syndrome vector may contain a specific combination of non-zero entries. Presence of any non-zero entry may indicate error in the check meter 204.

As an illustrative example, smart meter 204-6 may include measurement error. Therefore, an exemplary value of the syndrome vector for the second check smart meter 204-6 in the NTL detection module 210 of the second check smart meter 204-6 may be determined as:

$$\tilde{s}_{Ep} = \hat{E}_p \cdot D + E_{PL} \cdot D = \begin{pmatrix} E_{p1} \\ E_{p2} \\ E_{p3} \\ E_{p4} \\ E_{p5} \\ E_{p6} + e_{E_{p6}} \\ E_{p7} \end{pmatrix}^T \cdot D + \begin{pmatrix} \frac{R_1 A_1}{\alpha} \\ \frac{R_2 A_2}{\alpha} \\ \frac{R_3 A_3}{\alpha} \\ \frac{R_4 A_4}{\alpha} \\ 0 \\ 0 \\ 0 \end{pmatrix}^T \cdot D = \quad (22)$$

$$\begin{pmatrix} E_{p1} + E_{p2} + E_{p4} - E_{p5} + \frac{R_1 A_1}{\alpha} + \frac{R_2 A_2}{\alpha} + \frac{R_4 A_4}{\alpha} \\ E_{p1} + E_{p3} + E_{p4} - (E_{p6} + e_{E_{p6}}) + \frac{R_1 A_1}{\alpha} + \frac{R_3 A_3}{\alpha} + \frac{R_4 A_4}{\alpha} \\ E_{p2} + E_{p3} + E_{p4} - E_{p7} + \frac{R_2 A_2}{\alpha} + \frac{R_3 A_3}{\alpha} + \frac{R_4 A_4}{\alpha} \end{pmatrix} =$$

$$[0 \; -e_{E_{p6}} \; 0]$$

The equation 22 indicates the magnitude of the error as $-e_{E_{p6}}$. In one embodiment, the NTL detection module 210 may compare the combination of non-zero terms of the syndrome vector with the rows of the decoding matrix D. The NTL detection module 210 may then identify that there is an error in the second check smart meter 204-6 given the location of the error term and the terms of the decoding matrix. In one embodiment, a syndrome vector with a single non-zero term can signify that the error is in a check meter. The check meter location of the error can be the index of the non-zero term in the syndrome vector. For example, an error term in the second term of the syndrome vector can indicate an error at the second check meter in the system.

Accordingly, the smart meter 204 may be configured to determine a location of the non-technical loss. In this exemplary case, the location of the faulty meter would be the sixth smart meter based upon the value of the syndrome vector. In another illustrative example, a non-zero term $[-e_{Ep5} \; 0 \; 0]$ in the syndrome vector may be identified as error having a magnitude of $-e_{Ep5}$ in the fifth smart meter in the power system.

In one embodiment, a smart meter with a measurement error may be corrected once the NTL is detected by the present invention. In one embodiment, a manual inspection, e.g., by a utility company, may be performed. The manual inspection may confirm a location of measurement error based on the NTL detected by the system. In one embodiment, the inspection may be used to determine a source of error, e.g., tampering, cable tapping, time skew, etc. As such the NTL detection module 210 of the second check smart meter 204-6 is configured to correct for time skew in measurements over the at least one time interval using the active energy and the reactive energy flowing through the power cable 202. In one embodiment, the NTL detection module 210 may be further configured to correct for error, e.g., tampering or time skew in measurements over the at least one time interval using the active energy and the reactive energy flowing through the power cable 202. The error term is determined in the syndrome vector. Therefore, the corrected value may be obtained by adding an error vector to the measured quantities of active and reactive energies of the power cable as below:

$$\hat{E}_{P_{corrected}} = \hat{E}_p + e_{E_p}, \quad (12)$$

where, $\hat{E}_{p_{corrected}}$ is the vector of corrected active energy, and and $e_{E_p}$, is error vector of active energy derived from the syndrome vector $$e_{E_p} = [0\ 0\ 0\ 0\ 0\ -e_{E_{p6}}\ 0]. \tag{13}$$

Based upon the equation 23 and 24, the NTL detection module 210 may correct the active energy such that the vector of corrected active energy $\hat{E}_{p_{corrected}}$ is now equal to the actual active energy $E_p$.

Similarly, the NTL detection module 210 can correct the measurement of the reactive energy of the smart meter 6 in the same manner as below:

$$\hat{E}_{q_{corrected}} = \hat{E}_q + e_{E_q}, \tag{14}$$

where, $E_{q_{corrected}}$ is the vector of corrected reactive energy, and and $e_{E_q}$, is error vector of reactive energy derived from the syndrome vector $$e_{E_q} = [0\ 0\ 0\ 0\ 0\ -e_{E_{q6}}\ 0]. \tag{156}$$

Based upon the equation 25 and 26, the NTL detection module 210 may detect that the vector of corrected reactive energy $E_{q_{corrected}}$ is now equal to the actual active energy $E_q$. In an embodiment, the smart meter 204 itself can be configured to detect a source of NTL in the electrical power system.

(3) When a Regular Meter Contains Error

In another exemplary embodiment, a regular meter may contain error, e.g., due to either tampering, time skew, cable tapping or cyber-attack in the power distribution network. The NTL detection module 210 may calculate the value of a syndrome vector. In an embodiment, the syndrome vector may be communicated to a remote power station (not shown) on a timely basis wherein the remote station displays or plots the graphical value of syndrome vector for analyzing the error in the regular meter.

The NTL detection module 210 may calculate the vectors of active and reactive energy as well as active and reactive energy losses based on the measurements of the regular smart meter 204. When a regular smart meter 204, e.g., the third regular smart meter 204-3, is a source of error, vectors of energy measurements $\hat{E}_p$ and $\hat{E}_q$ and vectors of energy losses $\hat{E}_{PL}$ and $\hat{E}_{QL}$ for the third regular smart meter 204-3 are incorrect such that $$\hat{E}_p \neq E_p, \text{ and } \hat{E}_q \neq E_q, \tag{27}$$

and, $$\hat{E}_{PL} \neq E_{PL}, \text{ and } \hat{E}_{QL} \neq E_{QL}, \tag{16}$$

Accordingly, the syndrome vector for active energy is given as, $$\tilde{s}_{Ep} = \hat{E}_p \cdot D + E_{PL} \cdot D = \tag{29}$$

$$\begin{pmatrix} E_{p1} \\ E_{p2} \\ E_{p3} + e_{E_{p3}} \\ E_{p4} \\ E_{p5} \\ E_{p6} \\ E_{p7} \end{pmatrix}^T \cdot D + \begin{pmatrix} \frac{R_1 A_1}{\alpha} \\ \frac{R_2 A_2}{\alpha} \\ \frac{R_3 (A_3 + e_{A_3})}{\alpha} \\ \frac{R_4 A_4}{\alpha} \\ 0 \\ 0 \\ 0 \end{pmatrix}^T \cdot D = \begin{pmatrix} 0 \\ e_{E_{p3}} + \frac{R_3 e_{A_3}}{\alpha} \\ e_{E_{p3}} + \frac{R_3 e_{A_3}}{\alpha} \end{pmatrix}^T,$$

where $e_{A_3}$ is the error in the measurement of the area under the squared RMS current curve of the third regular smart meter 204-3. Accordingly, there would be two places of the syndrome vector where non-zero terms would appear.

The syndrome vector for reactive energy may similarly be given as:

$$\tilde{s}_{Eq} = \hat{E}_q \cdot D + E_{QL} \cdot D = \begin{pmatrix} 0 \\ e_{E_{q3}} + \frac{X_3 e_{A_3}}{\alpha} \\ e_{E_{q3}} + \frac{X_3 e_{A_3}}{\alpha} \end{pmatrix}^T. \tag{30}$$

Each error term in the syndrome vector may represent the magnitude of error in the corresponding energy measured by the meter and error in the area under the squared current RMS curve reported by the meter. The NTL detection module 210 may compare the combination of non-zero elements in the syndrome vector of active as well as reactive energies with the non-zero elements of the decoding matrix D. Accordingly, the NTL detection module 210 may be configured to determine a location of the error. In the present example, the NTL detection module 210 may confirm that the location of the meter in error is the third regular smart meter 204-3. The error terms in the syndrome vector present a challenge in determining the individual error due to measurement of the area under the squared RMS current curve and the error due to energy measurement by the smart meter.

In one embodiment, a syndrome vector with more than one non-zero terms can signify that the error is in a regular meter. The location of the error can be determined using the configuration matrix H. In a system of $N = 2^M - M - 1$ regular meters, the locations of the non-zero terms in the syndrome vector will match the locations of non-zero terms (1) of one row of the configuration matrix H because the terms with only one 1 have been omitted from the configuration matrix. Each row of the configuration matrix H corresponds to a regular meter in the system. Therefore, the location of the error in the system can be identified as the regular meter with a row in the configuration matrix H having non-zero terms in the same locations as the non-zero terms of the syndrome vector.

For example, the syndrome vector in a system with 3 check meters and 4 regular meters can have the form: $\tilde{s}_{Ep} = [e\ e\ 0]$. The first row of the configuration matrix H for this system is [1 1 0]. The non-zero terms of the syndrome vector and the non-zero terms of the first row of the configuration matrix H are in the same location. Thus, it can be determined based on the syndrome vector that the error in the system can be attributed to the first regular meter. In another example, the syndrome vector for the same system can have the form $\tilde{s}_{Ep} = [e\ e\ e]$. The fourth row of the configuration matrix H is [1 1 1]. Thus, it can be determined based on the syndrome vector that the error in the system can be attributed to the fourth regular meter. The magnitude of the error can be determined to be the value of the error term e in the syndrome vector.

In the illustrative example, the NTL detection module 210 may determine the individual error terms by adding the incorrect measurement of active energy losses of the third regular smart meter 204-3 (that is, $$\frac{R_3(A_3 + e_{A_3})}{\alpha}$$

) to the incorrect active energy measured by the third regular smart meter 204-3 (that is, $E_{p3}+e_{E_{p3}}$), and then subtracting the value of the non-zero entry in the syndrome vector (that is, $$e_{E_{p3}} + \frac{R_3 e_{A_3}}{\alpha}$$

). Similarly, the NTL detection module 210 may also add the incorrect measurement of reactive energy losses of the third regular smart meter 204-3 (that is, $$\frac{X_3(A_3 + e_{A_3})}{\alpha}$$

) to the incorrect reactive energy measured by the third regular smart meter 204-3 (that is, $E_{q3}+e_{E_{q3}}$), and then subtract the value of the non-zero entry in the syndrome vector (that is, $$e_{E_{q3}} + \frac{X_3 e_{A_3}}{\alpha}$$

), as presented:

$$E_{p_{sd3}} = (E_{p3} + e_{E_{p3}}) + \frac{R_3(A_3 + e_{A_3})}{\alpha} - \left(e_{E_{p3}} + \frac{R_3 e_{A_3}}{\alpha}\right) \quad (31)$$
$$= E_{p3} + \frac{R_3 A_3}{\alpha}$$

$$E_{q_{sd3}} = (E_{p3} + e_{E_{p3}}) + \frac{X_3(A_3^2 + e_{A_3})}{\alpha} - \left(e_{E_{q3}} + \frac{R_3 e_{A_3}}{\alpha}\right) \quad (32)$$
$$= E_{p3} + \frac{X_3 A_3}{\alpha}$$

Here, $E_{p_{sd3}}$ and $E_{q_{sd3}}$ are the actual active and reactive energy at the sending end, which can reasonably be used to estimate energy consumption of the load.

Accordingly, $$\hat{E}_{p3_{corrected}} = E_{p_{sd3}}, \quad (33)$$

$$\hat{E}_{q3_{corrected}} = E_{q_{sd3}}, \quad (34)$$

Accordingly, the third regular smart meter 204-3 may detect the error and also correct the error in third regular smart meter 204-3 using the active energy as well as the reactive energy flowing through the power cable 202. In an embodiment, the smart meter itself can be configured to detect a source of NTL in the electrical power system. The present method of using active energy and reactive energy, as well as the area under the squared RMS current curve, presents an advantage over instantaneous power algorithms, which would fail to detect error in regular smart meters.

In one embodiment, the syndrome vector can have more than one non-zero term, wherein the non-zero terms are not identical. In one embodiment, this configuration can signify that there is simultaneous error in at least one check meter and error in at least one regular meter.

(4) Cable Tapping

In one embodiment, NTL in a regular meter may be a result of cable tapping in addition to or in place of error within the measurements of the regular meter. The NTL detection module 210 may be configured to estimate an amount of energy tapped from the power cable 202 using the syndrome vector. For example, the syndrome vector for the active energy loss may be calculated as:

$$\tilde{s}_{Ep} = \hat{E}_p \cdot D + E_{PL} \cdot D = \begin{pmatrix} E_{p1} \\ E_{p2} \\ E_{p3} \\ E_{p4} \\ E_{p5} \\ E_{p6} \\ E_{p7} \end{pmatrix}^T \cdot D + \begin{pmatrix} \frac{R_1 A_1}{\alpha} \\ \frac{R_2 A_2}{\alpha} \\ \frac{R_3 A_3}{\alpha} \\ \frac{R_4 A_4}{\alpha} \\ 0 \\ 0 \\ 0 \end{pmatrix}^T \cdot D \quad (35)$$

$$= \begin{bmatrix} 0 & -e_{E(tap)_{p3}} & -e_{E(tap)_{p3}} \end{bmatrix},$$

Similarly, the syndrome vector for the reactive energy loss is $$\tilde{s}_{Eq} = \hat{E}_q \cdot D + E_{QL} \cdot D = \begin{pmatrix} E_{q1} \\ E_{q2} \\ E_{q3} \\ E_{q4} \\ E_{q5} \\ E_{q6} \\ E_{q7} \end{pmatrix}^T \cdot D + \begin{pmatrix} \frac{X_1 A_1}{\alpha} \\ \frac{X_2 A_2}{\alpha} \\ \frac{X_3 A_3}{\alpha} \\ \frac{X_4 A_4}{\alpha} \\ 0 \\ 0 \\ 0 \end{pmatrix}^T \cdot D \quad (36)$$

$$= \begin{bmatrix} 0 & -e_{E(tap)_{q3}} & -e_{E(tap)_{q3}} \end{bmatrix},$$

where $e_{E(tap)_{p3}}$ and $e_{E(tap)_{q3}}$ are the total active energy loss and the reactive energy loss, respectively, which are consumed illegally due to tapping in the third power cable. Accordingly, the amount of energy tapped from the power cable 202 for the third regular smart meter 204-3 may be determined. The syndrome vector can be used to identify the location of potential cable tapping at a cable associated with a meter in error, as located by the syndrome vector.

(5) Cyber Attack

Cyber attacks on an electrical power system may occur on communication channels, on smart meters, or on stored data. In one embodiment, the NTL detection module may restore the correct readings of check meters or regular meters using the syndrome vector:

$$\tilde{s}_{Ep} = [\tilde{s}_{Ep1} \; \tilde{s}_{Ep2} \; \tilde{s}_{Ep3}] = (\hat{E}_p + \hat{E}_{PL}) \cdot D \quad (37)$$

$$\hat{E}_{PL} = \left[\frac{R_1A_1}{\alpha}, \frac{R_2A_2}{\alpha}, \frac{R_3A_3}{\alpha}, \frac{R_4A_4}{\alpha}, 0, 0, 0\right], \quad (38)$$

and $$\tilde{s}_{Eq} = [\tilde{s}_{Eq1}\ \tilde{s}_{Eq2}\ \tilde{s}_{Eq3}] = (\hat{E}_q + \hat{E}_{QL}) \cdot D \quad (39)$$

$$\hat{E}_{QL} = \left[\frac{X_1A_1}{\alpha}, \frac{X_2A_2}{\alpha}, \frac{X_3A_3}{\alpha}, \frac{X_4A_4}{\alpha}, 0, 0, 0\right], \quad (40)$$

In an illustrative example of an attack on a third regular smart meter 204-3, the NTL detection module 210 may restore the correct readings using error terms determined in the syndrome vector, that is $$\tilde{s}_{Ep} = \hat{E}_p \cdot D + E_{PL} \cdot D \quad (17)$$

$$= \begin{pmatrix} E_{p1} \\ E_{p2} \\ E_{p3} + e_{Ep3} \\ E_{p4} \\ E_{p5} \\ E_{p6} \\ E_{p7} \end{pmatrix}^T \cdot D + \begin{pmatrix} \frac{R_1A_1}{\alpha} \\ \frac{R_2A_2}{\alpha} \\ \frac{R_3(A_3 + e_{A_3})}{\alpha} \\ \frac{R_4A_4}{\alpha} \\ 0 \\ 0 \\ 0 \end{pmatrix}^T \cdot D$$

$$= \begin{pmatrix} 0 \\ e_{Eq3} + \frac{R_3 e_{A_3}}{\alpha} \\ e_{Eq3} + \frac{R_3 e_{A_3}}{\alpha} \end{pmatrix}^T,$$

And, $$\tilde{s}_{Eq} = \hat{E}_q \cdot D + E_{QL} \cdot D = \begin{pmatrix} 0 \\ e_{Eq3} + \frac{X_3 e_{A_3}}{\alpha} \\ e_{Eq3} + \frac{X_3 e_{A_3}}{\alpha} \end{pmatrix}^T. \quad (182)$$

Figure 5A:
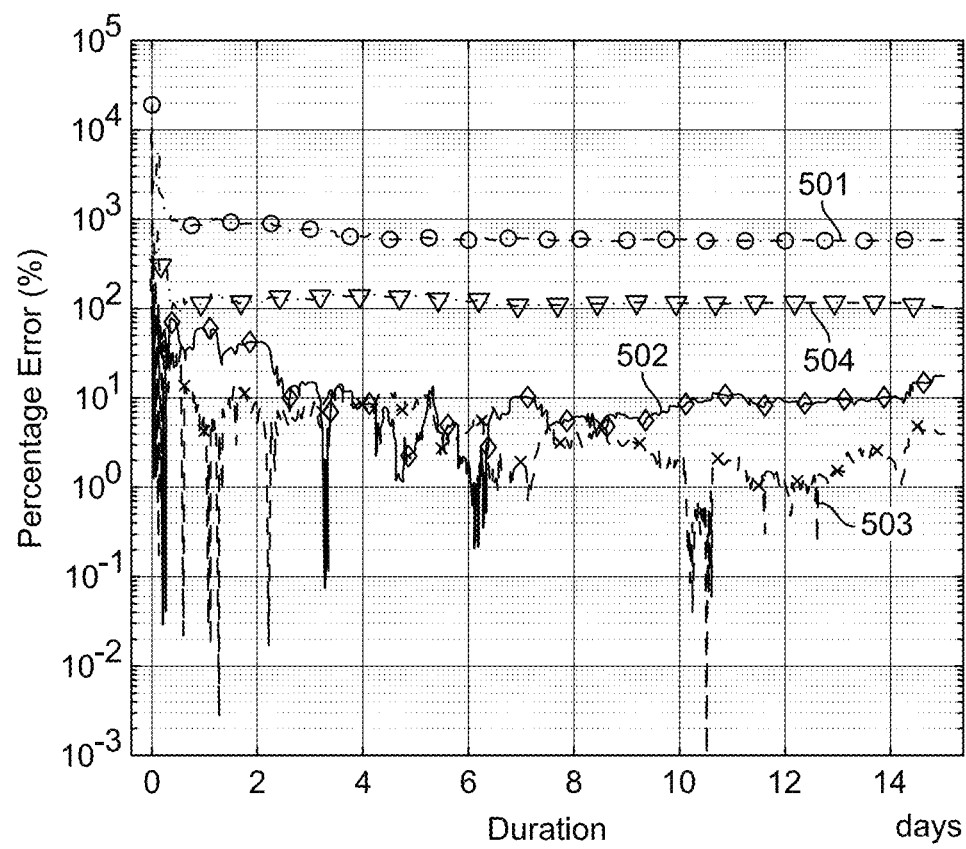
FIG. 5A illustrates a graph of percentage error in calculating a cable resistance using an algorithm of a prior, according to certain embodiments.
Figure 5B:
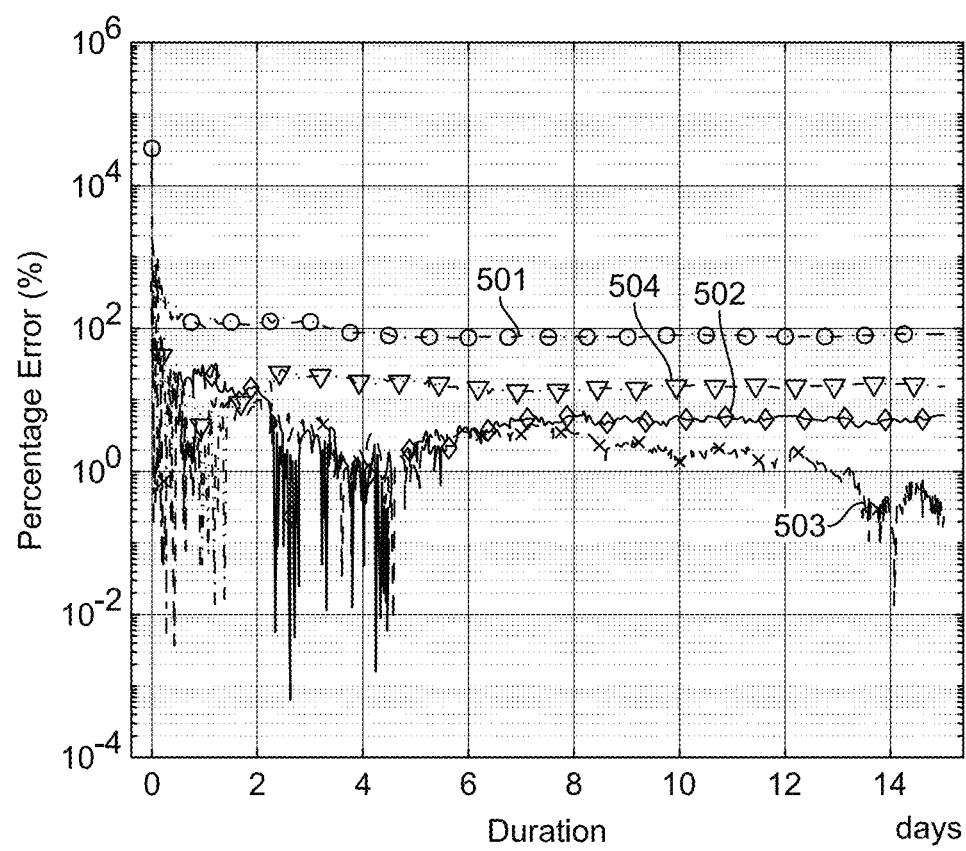
FIG. 5B illustrates a graph of percentage error in calculating a cable reactance using an algorithm of a prior art, according to certain embodiments.

FIGS. 5A and 5B illustrate a graph of percentage error in calculating the cable resistance and cable reactance, respectively, using instantaneous power and RMS current rather than energy and area under RMS curve. In a simulation of computing the cable resistance and the cable reactance, following parameters of the power cable 202 are used, as provided in table II below:

TABLE I

PROPERTIES OF CABLES USED IN SIMULATION [17]

| Parameter | | Parameter | |
|---|---|---|---|
| AWG: | 1/0 | Operating Voltage (V): | 230 |
| Stranding: | 19 | Operating Temperature (° C.): | 50 |
| Insulation Type: | XLPE | AC Resistance (mΩ/m): | 0.3821 |

TABLE I-continued

PROPERTIES OF CABLES USED IN SIMULATION [17]

| Parameter | | Parameter | |
|---|---|---|---|
| Ampacity in Duct (A): | 140 | Series Reactance (mΩ/m): | 0.1605 |

Using above properties of the power cable 202, a set of data of active power, reactive power, RMS voltage, and RMS current is generated based on actual residential load measurements. A predetermined random noise as well as a predetermined time skew is considered in the prior art algorithm. All data are reported to a receiving end, such as a utility company. The measurements are received once every hour. The cable resistance and the cable reactance are calculated at several time intervals using the prior art algorithm for the data of 15 days. Plurality of equations are solved using the LSM technique by the smart meter 204 or by hardware capable to calculate them at the utility company. The percentage error between the estimated values and the actual values for the cable resistances as well as the cable reactance is illustrated in FIG. 5A and FIG. 5B, respectively. FIG. 5A illustrates a curve 501 representing a resistance value (R1) of the power cable 202 connected with the first regular smart meter 202-1, a curve 502 represents a resistance value (R2) of the power cable 202 connected with the second regular smart meter 202-2, a curve 503 represents a resistance value (R3) of the power cable 202 connected with the third regular smart meter 202-3 and a curve 504 represents a resistance value (R4) of the power cable 202 connected with the fourth regular smart meter 202-4. Also, FIG. 5B illustrates a curve 501 representing a reactance value (X1) of the power cable 202 connected with the first regular smart meter 202-1, a curve 502 represents a reactance value (X2) of the power cable 202 connected with the second regular smart meter 202-2, a curve 503 represents a reactance value (X3) of the power cable 202 connected with the third regular smart meter 202-3 and a curve 504 represents a reactance value (X4) of the power cable 202 connected with the fourth regular smart meter 202-4. It is found that the percentage error in computing the cable resistance (R) and the cable reactance (X) is quite high when the prior art algorithm is used. Accordingly, due to the effect of time skew, the error in calculating the cable resistance and cable reactance for 15 days using the algorithm used in the prior art is unacceptably high.

Figure 6A:
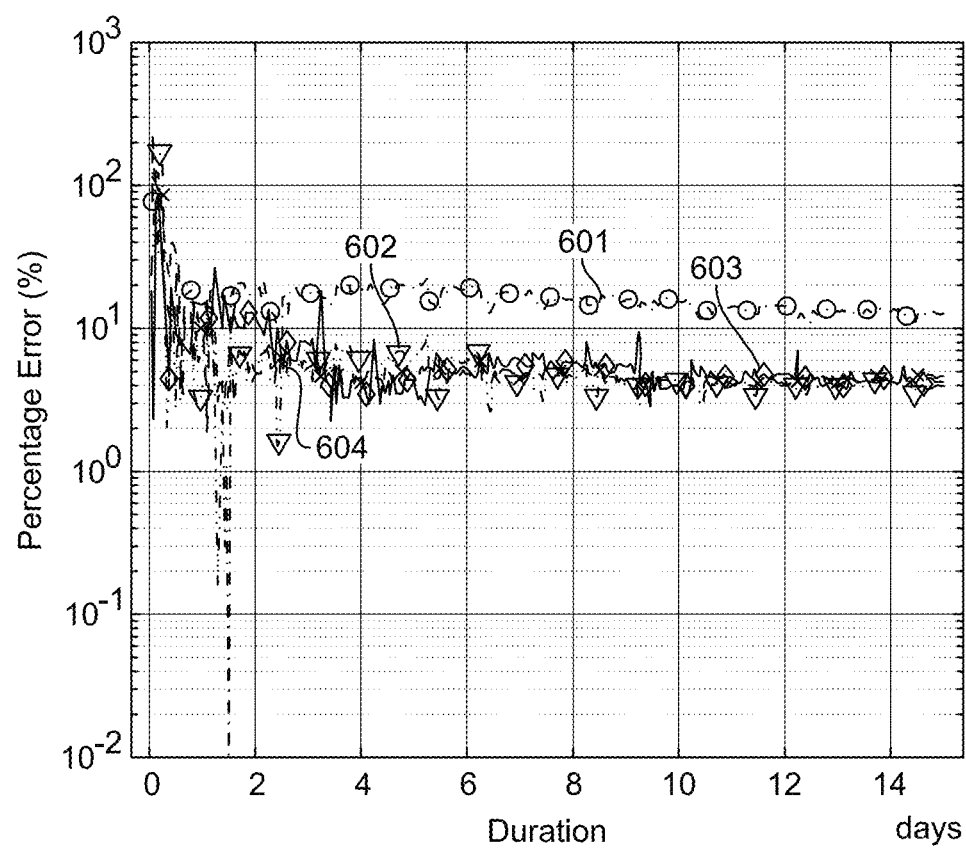
FIG. 6A illustrates a graph of percentage error in calculating the cable resistance using non-technical losses (NTL) detection module at a separate time interval window, according to certain embodiments.
Figure 6B:
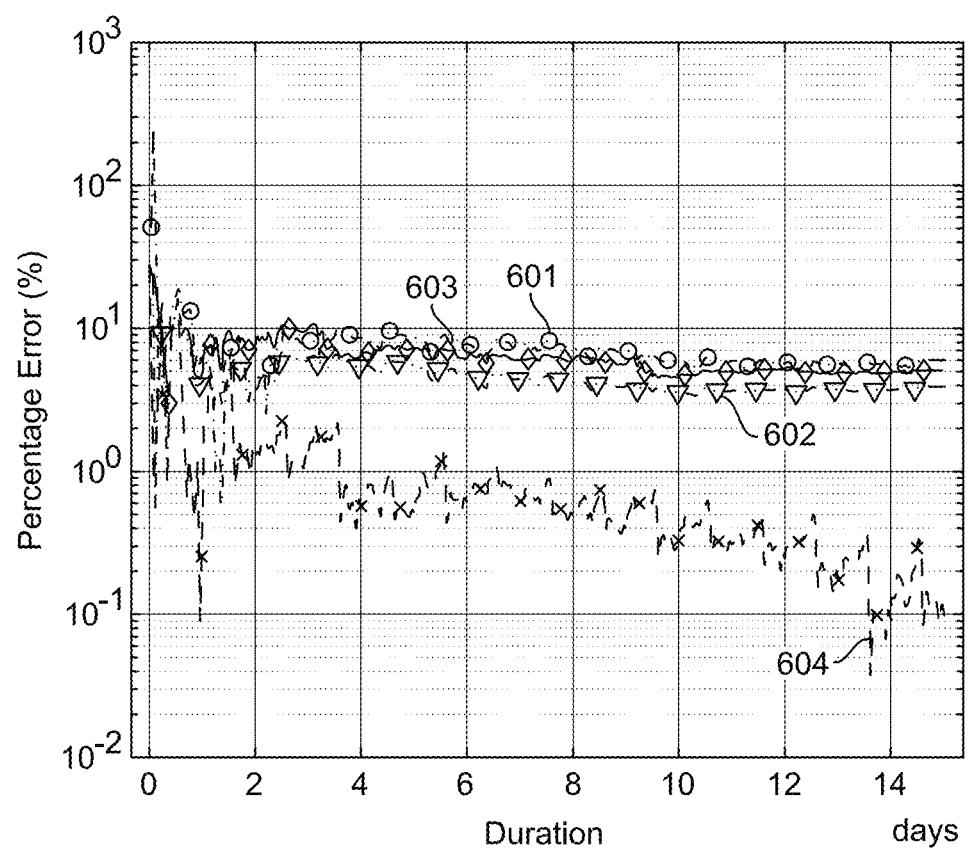
FIG. 6B illustrates a graph of percentage error in calculating the cable reactance using the NTL detection module at a separate time interval window, according to certain embodiments.

FIGS. 6A and 6B illustrates a graph of percentage error in calculating the cable resistance and cable reactance, respectively, using the NTL detection module 210 of the present disclosure at separate time interval window that uses the area under RMS current, according to certain embodiments of the disclosure. A set of data of active energy, reactive energy, and the area under the squared current is generated for different intervals by the smart meter 204 of the present disclosure. In one embodiment, the time intervals are assumed as separate time intervals without overlap. The data may be reported at the receiving end. The measurements are received once every hour. The cable resistance and the cable reactance are calculated at several time intervals for the data over 15 days. The plurality of equations may be solved using a least squares method. The percentage error between the estimated values and the actual values for the cable resistances as well as the cable reactance is illustrated in FIGS. 6A and 6B, respectively. FIG. 6A again illustrates a curve 601 representing a resistance value (R1) of the power cable 202 connected with the first regular smart meter 202-1, a curve 602 represents a resistance value (R2) of the power cable 202 connected with the second regular smart meter 202-2, a curve 603 represents a resistance value (R3) of the power cable 202 connected with the third regular smart meter 202-3 and a curve 604 represents a resistance value (R4) of the power cable 202 connected with the fourth regular smart meter 202-4. Also, FIG. 6B illustrates a curve 601 representing a reactance value (X1) of the power cable 202 connected with the first regular smart meter 202-1, a curve 602 represents a reactance value (X2) of the power cable 202 connected with the second regular smart meter 202-2, a curve 603 represents a reactance value (X3) of the power cable 202 connected with the third regular smart meter 202-3 and a curve 604 represents a reactance value (X4) of the power cable 202 connected with the fourth regular smart meter 202-4. It is found that the percentage error in computing the cable resistance (R) and the cable reactance (X) is much lower than the percentage error of prior art algorithms. The result also shows that the effect of time skew is minimized and accuracy in calculating the cable resistance and the cable reactance is improved.

Figure 7A:
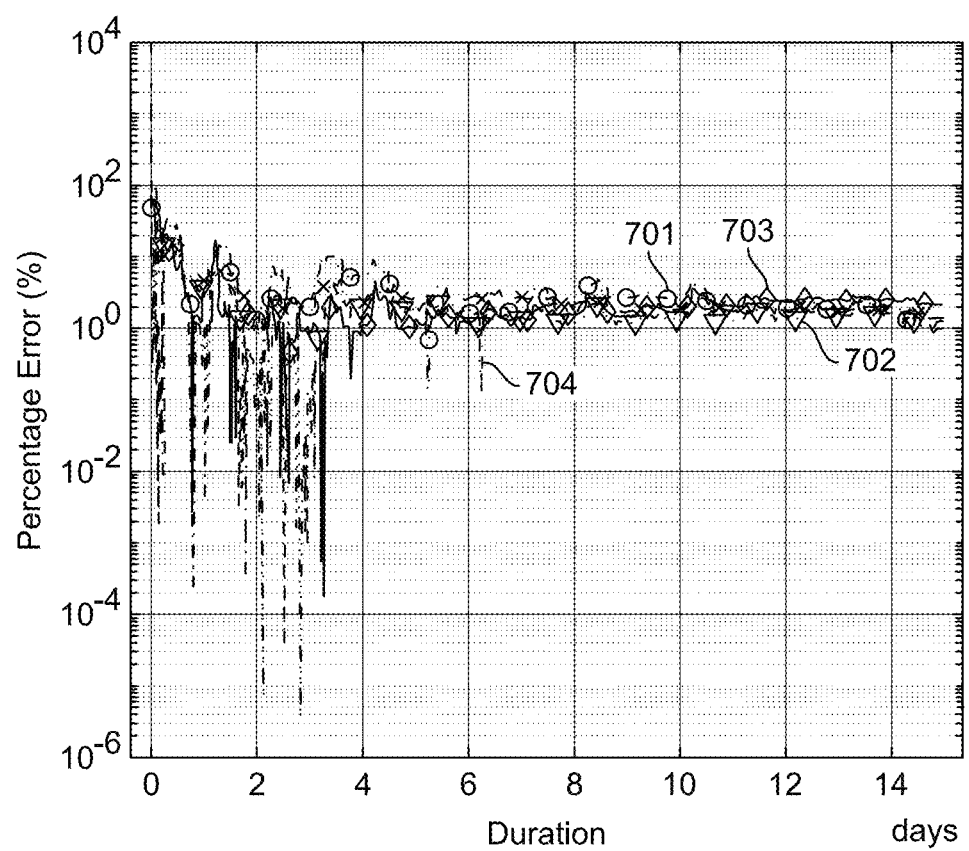
FIG. 7A illustrates a graph of percentage error in calculating the cable resistance using the NTL detection module of the present disclosure at overlapping time windows, according to certain embodiments.
Figure 7B:
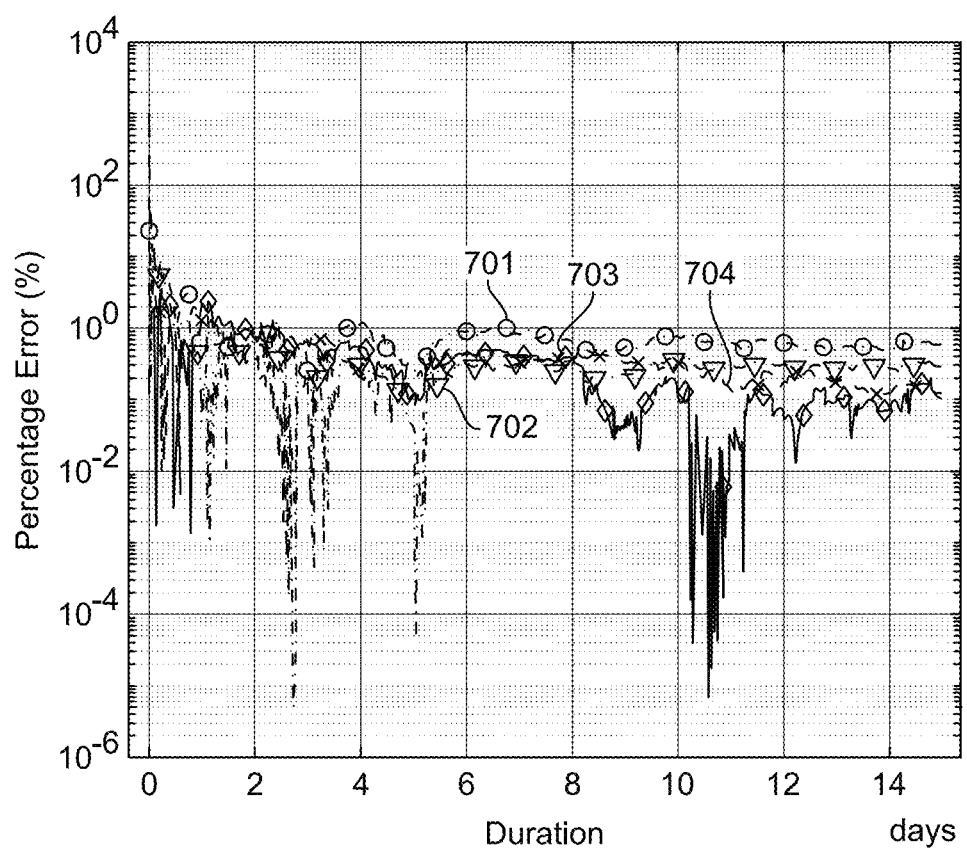
FIG. 7B illustrates a graph of percentage error in calculating the cable reactance using the NTL detection module of the present disclosure at overlapping time windows, according to certain embodiments.

FIGS. 7A and 7B illustrate the graph of percentage error in calculating the cable resistance and cable reactance, respectively, using the NTL detection module 210 of the present disclosure at overlapping time windows that uses the area under RMS current, according to certain embodiments of the disclosure. The same set of data is considered as in case of separate window in FIG. 6A and FIG. 6B. FIG. 7A again illustrates a curve 701 representing a resistance value (R1) of the power cable 202 connected with the first regular smart meter 202-1, a curve 702 represents a resistance value (R2) of the power cable 202 connected with the second regular smart meter 202-2, a curve 703 represents a resistance value (R3) of the power cable 202 connected with the third regular smart meter 202-3 and a curve 704 represents a resistance value (R4) of the power cable 202 connected with the fourth regular smart meter 202-4. Also, FIG. 7B illustrates a curve 701 representing a reactance value (X1) of the power cable 202 connected with the first regular smart meter 202-1, a curve 702 represents a reactance value (X2) of the power cable 202 connected with the second regular smart meter 202-2, a curve 703 represents a reactance value (X3) of the power cable 202 connected with the third regular smart meter 202-3 and a curve 704 represents a reactance value (X4) of the power cable 202 connected with the fourth regular smart meter 202-4. It is found that the percentage error in computing the cable resistance and the cable reactance is further reduced to 3% compared to the percentage error of known power-based algorithms. The result shows that the effect of time skew is further minimized and accuracy in calculating the cable resistance and the cable reactance is even more improved. This is due to the fact that the moving window or overlapping windows provide more data samples, for the same duration, compared to the case of calculation performed using separate windows. The duration of the overlap between the consecutive overlapping time windows may be automatically and/or manually adjusted. In one embodiment, the duration of the overlap may be automatically determined by a smart meter based on a resulting accuracy of cable impedance.

Figure 8A:
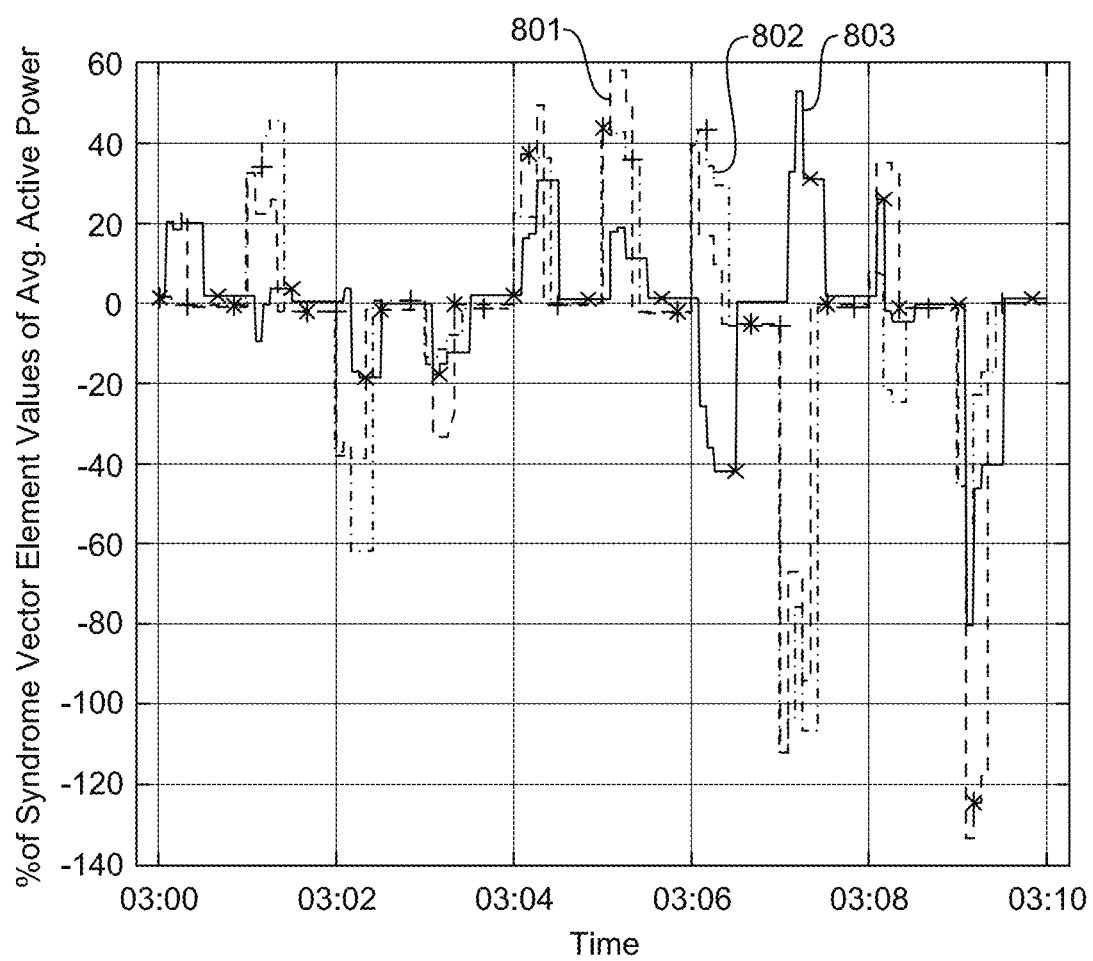
FIG. 8A illustrates a zoomed-in window of the normalized syndrome vector values of average active power derived with a prior art algorithm when "no meter" contains an error, according to certain embodiments.

FIG. 8A is a graph of normalized syndrome vector values derived using average active power rather than energy. A first syndrome vector 801, a second syndrome vector 802, and a third syndrome vector 803 represent normalized syndrome vector values of the average active power in a power distribution system 200 without smart meter error. When no smart meters contain error, the syndrome vectors are theoretically zero vectors. However, in a practical scenario, their values are small but not zero. The normalized syndrome vector values are calculated by dividing the syndrome vectors by the average of the power consumed by the loads. In this case, the normalized vectors return quite large values that are more than 120% of the average power consumption due to time skew effect. Accordingly, the reported values of the syndrome vector are inaccurate and do not represent smart meters without error.

Figure 8B:
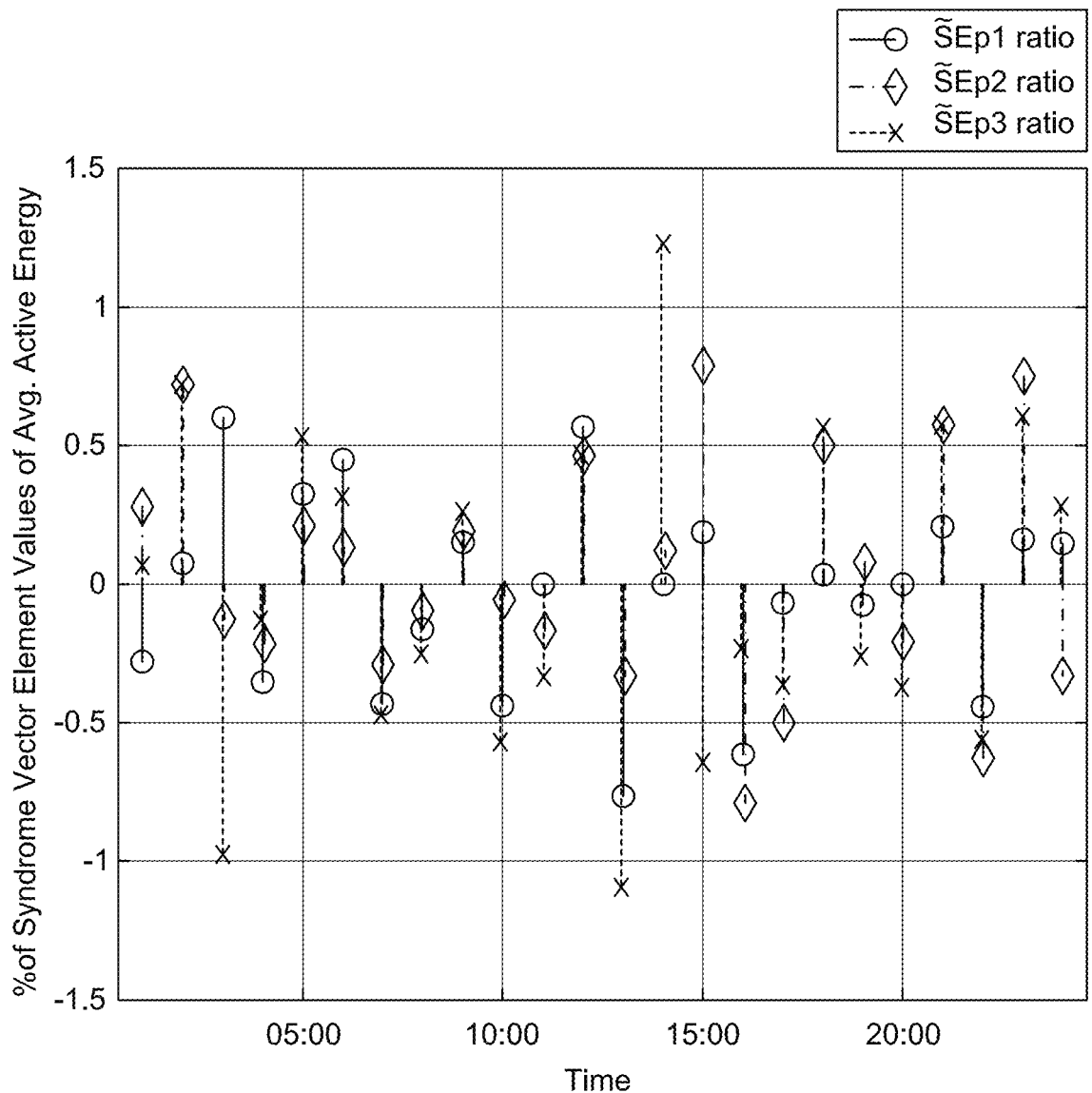
FIG. 8B illustrates a zoomed-in window of the normalized syndrome vector values of average active energy derived with the NTL detection module of the present disclosure when "no meter" contains an error, according to certain embodiments.

FIG. 8B is a graph of normalized syndrome vector values derived using active energy using the NTL detection module 210 according to one embodiment of the present disclosure in a power distribution system 200 without smart meter error. The NTL detection module 210 may use active energy, reactive energy, and the area under the RMS current curve even for error detection and correction in the smart meter 204. When no smart meters contain error, the syndrome vector is theoretically a zero vector. In this embodiment, using active energy results in small normalized syndrome vectors, e.g., less than 1.5%, compared to syndrome vectors derived from instantaneous power. The effect of time skew is minimized when using the present method. Accordingly, the reported values of the syndrome vector also correspond to smart meters without error.

Figure 9A:
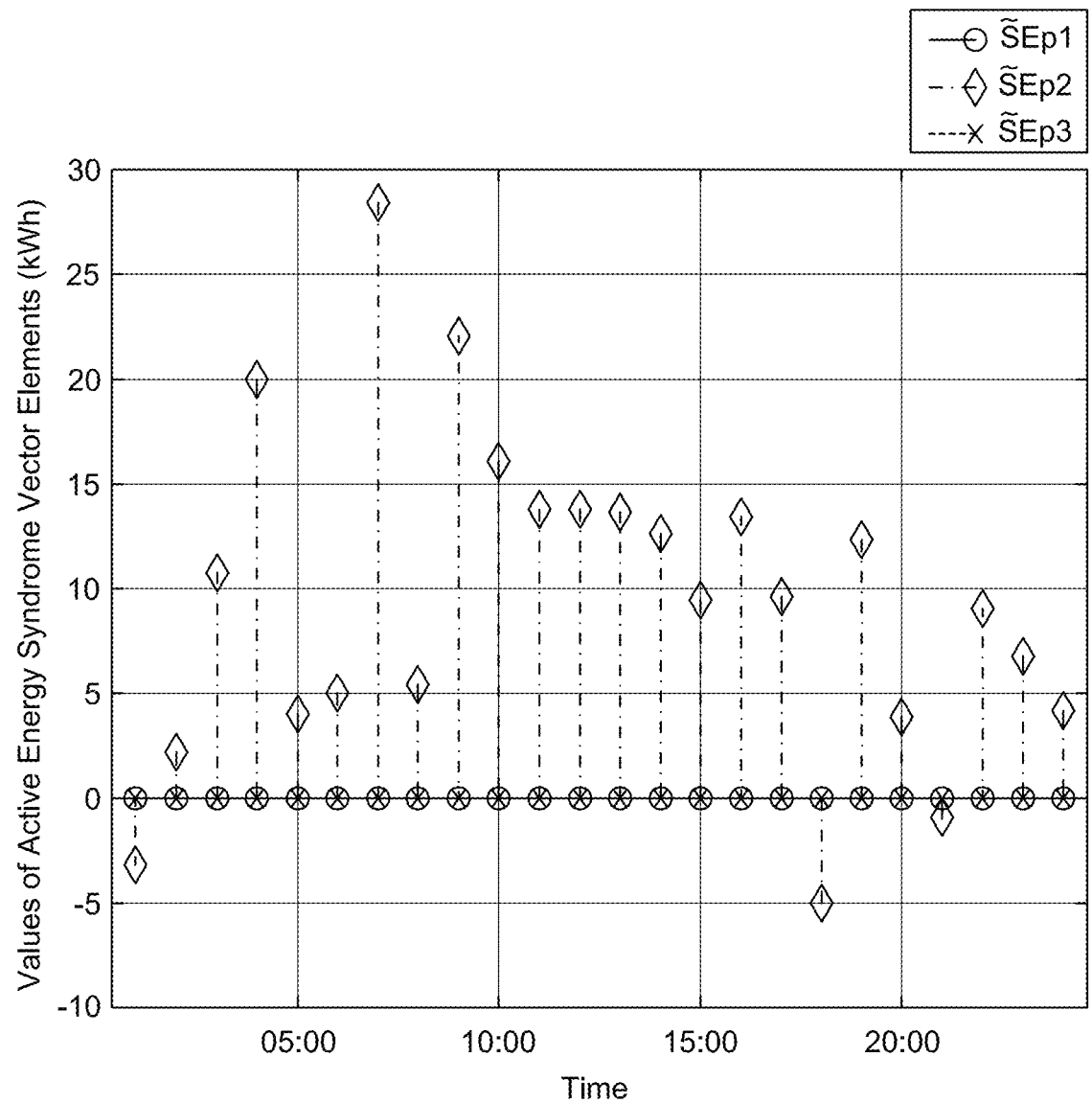
FIG. 9A illustrates a graph of active energy syndrome vector using NTL detection module when a check meter contains an error, according to an embodiment of the present disclosure.

FIG. 9A illustrates a graph of active energy syndrome vector using the NTL detection module 210 when a check meter contains error, according to an embodiment. When there is tampering with a smart meter 204, e.g., check smart meter 204-6, the first and third terms of the syndrome vector may be zero or near-zero terms. However, the second term of the syndrome vector may be relatively large compared to the first and third terms. This difference in value may persist throughout the day as measurements are recorded and reported. The value of the second term may indicate tampering or error in a smart meter. Accordingly, the location of the smart meter with error may be determined based upon the position of the non-zero term of the syndrome vector. The value of the error is equal to the magnitude of the non-zero term in the syndrome vector. The value and the location of non-zero element in the syndrome vector therefore yields the meter with tampering or error. The error in the check meter can also be easily corrected using the non-zero error term.

Figure 9B:
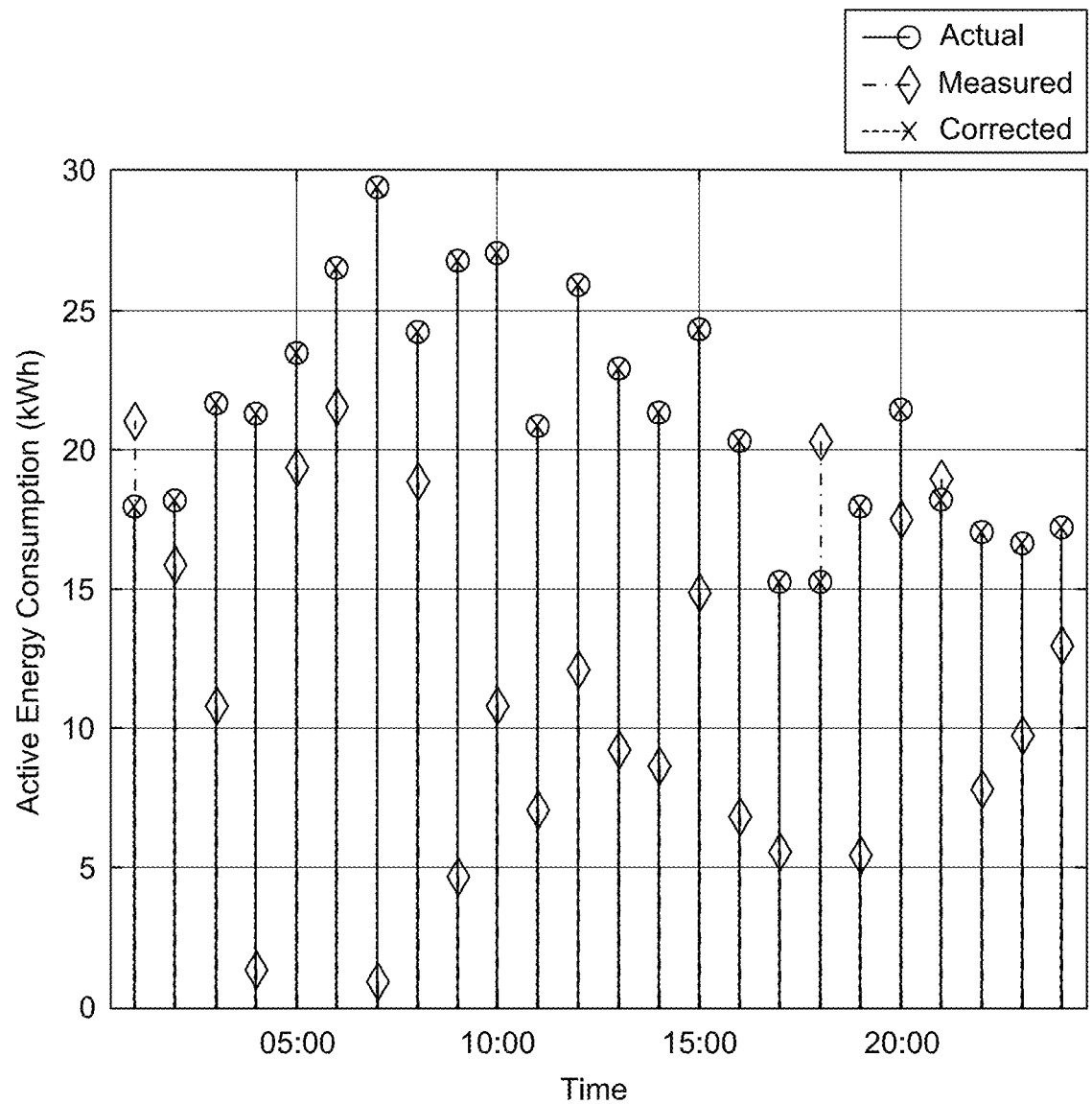
FIG. 9B illustrates a graph of active energy consumption and correction if tampering occurs in a check meter, according to certain embodiments.

FIG. 9B illustrates a graph of active energy consumption and correction if tampering occurs in a check meter, according to an embodiment. The corrected value may be determined based on the error term, wherein the error term is based on the non-zero term or terms of the syndrome vector. The corrected value may be determined by adding the magnitude of the error term to the measured value. It is clear from the graph that the deviation of the actual value of the consumed energy from the corrected value restored in the check smart meter is quite low. Accordingly, the NTL detection module may accurately correct the error in the check meter.

Figure 10:
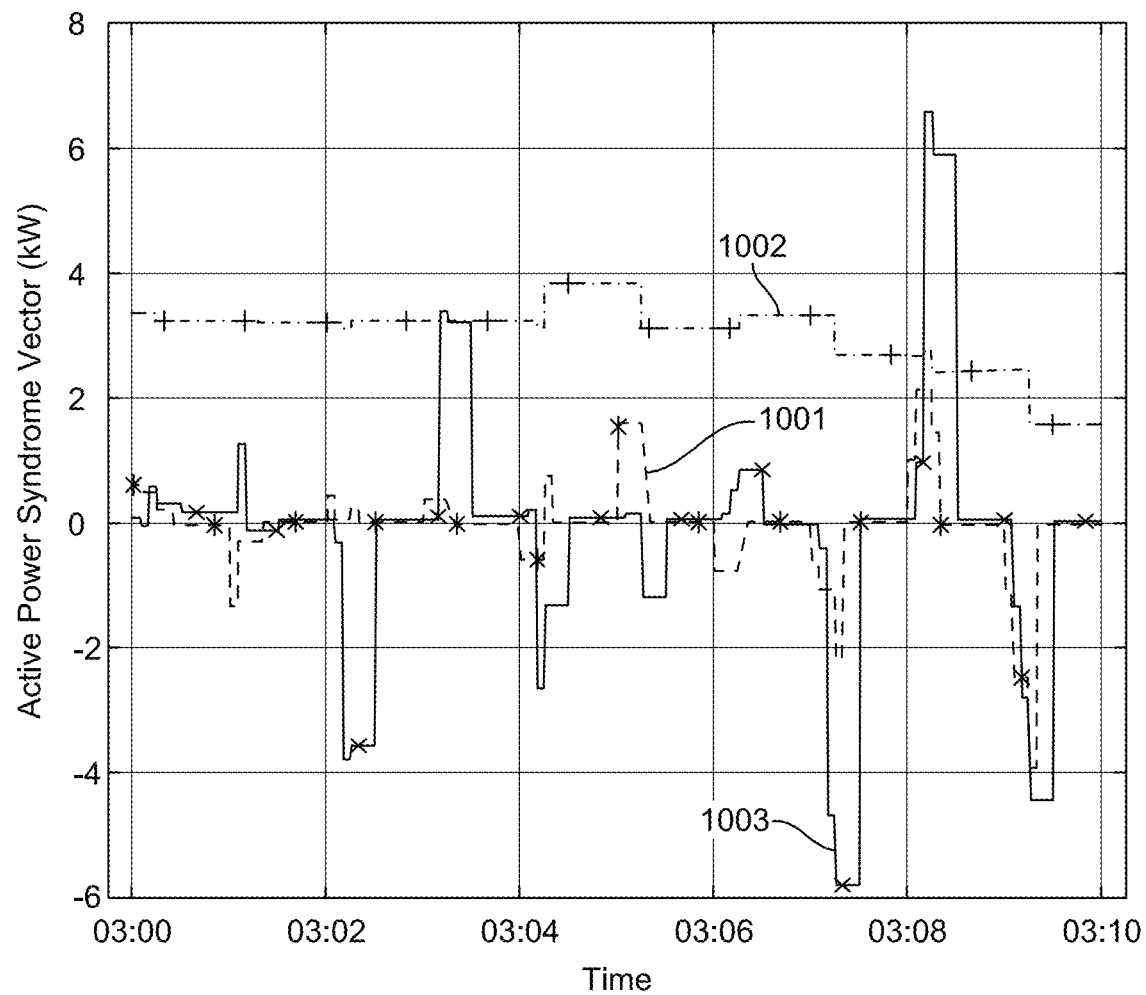
FIG. 10 illustrates a graph of active power syndrome vector using a prior art algorithm when a check meter contains error, according to certain embodiments.

FIG. 10 illustrates a graph of syndrome vectors derived from active power when a check meter contains error. In this case, as discussed earlier, the active power, reactive power, and RMS value of the current are considered for the calculation of syndrome vector. A first normalized syndrome vector 1001, a second normalized syndrome vector 1002, and a third normalized syndrome vector 1003 are derived from active power in the power distribution system 200. In an exemplary embodiment, there syndrome vectors may represent error or tampering in the second check smart meter 204-6. The active power syndrome vector should ideally return zero or near-zero values at the first and the third location. However, due to time skew in the measurements, the first and third elements of the syndrome vector are significant non-zero terms. This indication would give a wrong detection of error in the second check smart meter 204-6. For example, the non-zero values at the first and third terms of the syndrome vector would falsely indicate that there is an error in the first check smart meter 204-5 or the third check smart meter 204-7 rather than the second check smart meter 204-6.

Figure 11A:
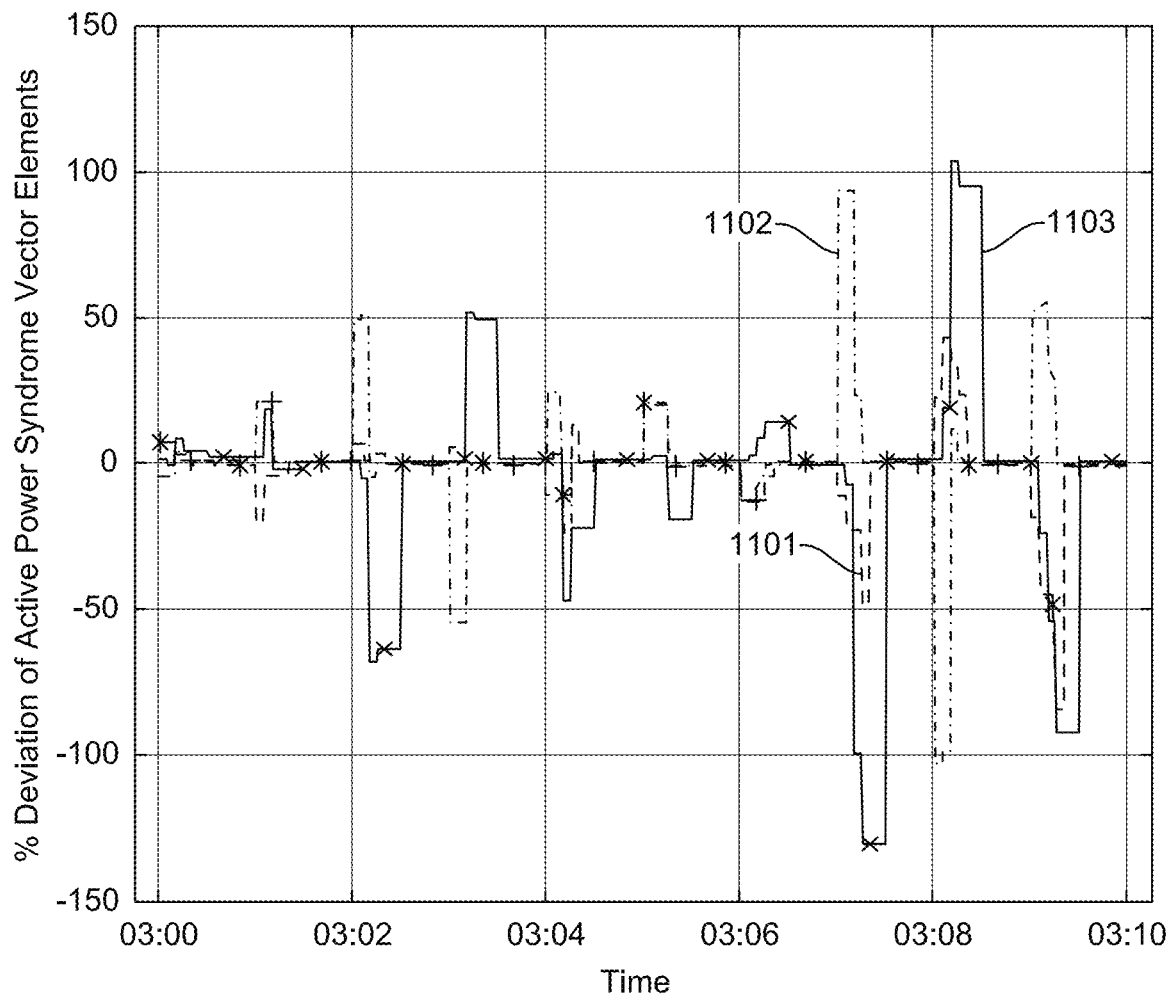
FIG. 11A illustrates a normalized deviation of syndrome vector values for 10 minutes duration in case a prior art algorithm is used for error detection or correction, according to certain embodiments.

FIG. 11A illustrates a normalized deviation of the syndrome vector values for a 10 minute duration using the instantaneous power for error detection or correction. The first curve 1101, second curve 1102, and third curve 1103 represent a deviation of the active power syndrome vector values in the power distribution system 200. In this case, as discussed earlier, the active power, reactive power, and RMS value of the current are considered for the calculation of syndrome vector. However, due to time skew, the smart meter is unable to identify the error in the meter based on the syndrome vector, even if an error has occurred in the check meter, for example second check smart meter 204-6. The graph illustrates that the normalized value of the syndrome vector when calculated using active power and reactive power could even exceed more than 100% of the value of the load at all three positions, that is $S_{p1}$, $S_{p2}$ and $S_{p3}$.

Figure 11B:
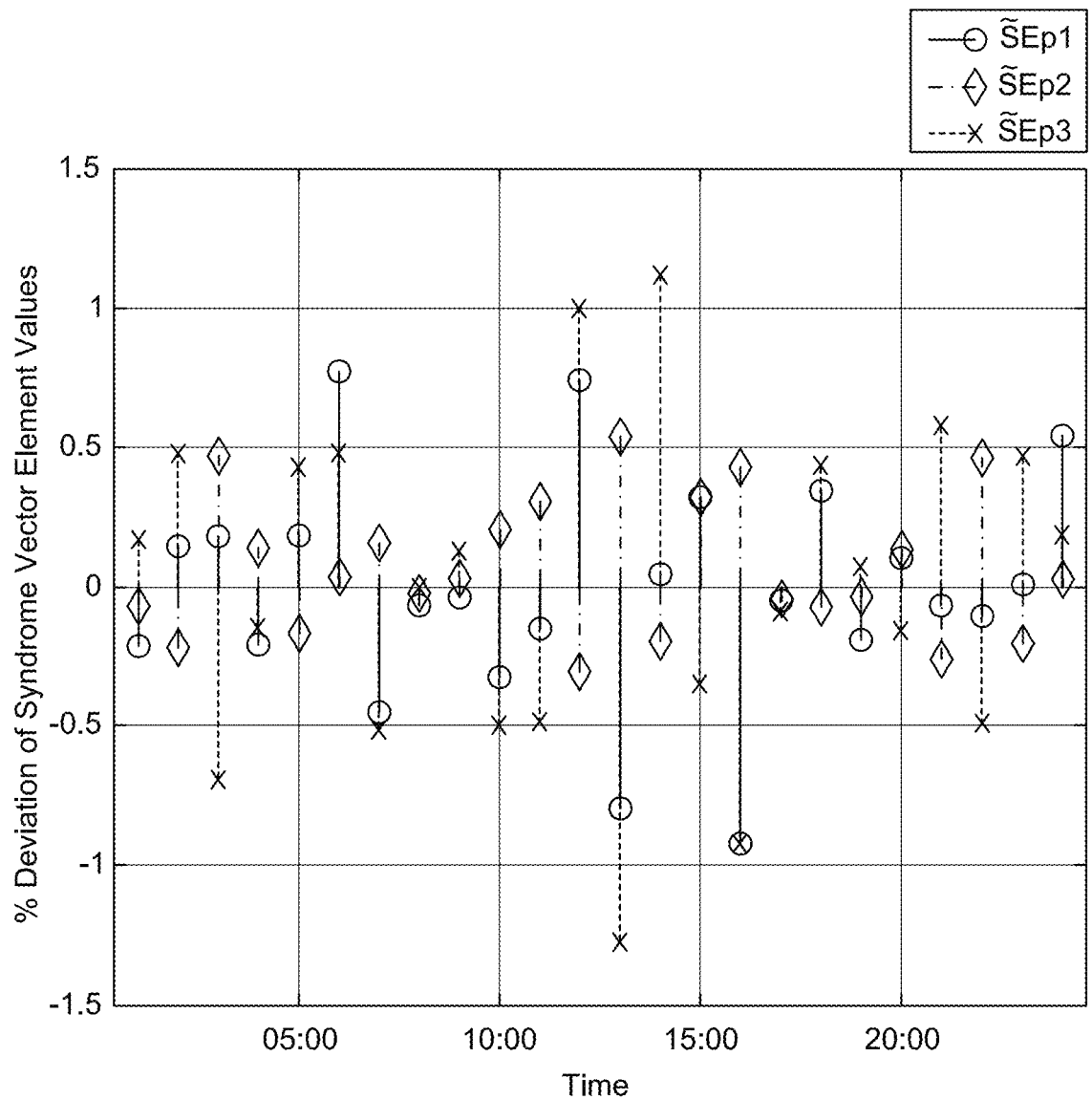
FIG. 11B illustrates a normalized deviation of syndrome vector values for 10 minutes duration in case NTL detection module is used for error detection or correction, according to certain embodiments.

FIG. 11B illustrates a normalized deviation of the syndrome vector values for 10 minutes duration using the NTL detection module for error detection or correction, according to an embodiment. In this case, as discussed earlier, the active energy, reactive energy and area under the squared RMS current curve is considered for the calculation of syndrome vector. In this case, the percentage deviations are examined that are less than 1.5%. Accordingly, the effect of time skew is minimized when using the energy-based NTL detection algorithm of the present invention.

Figure 12A:
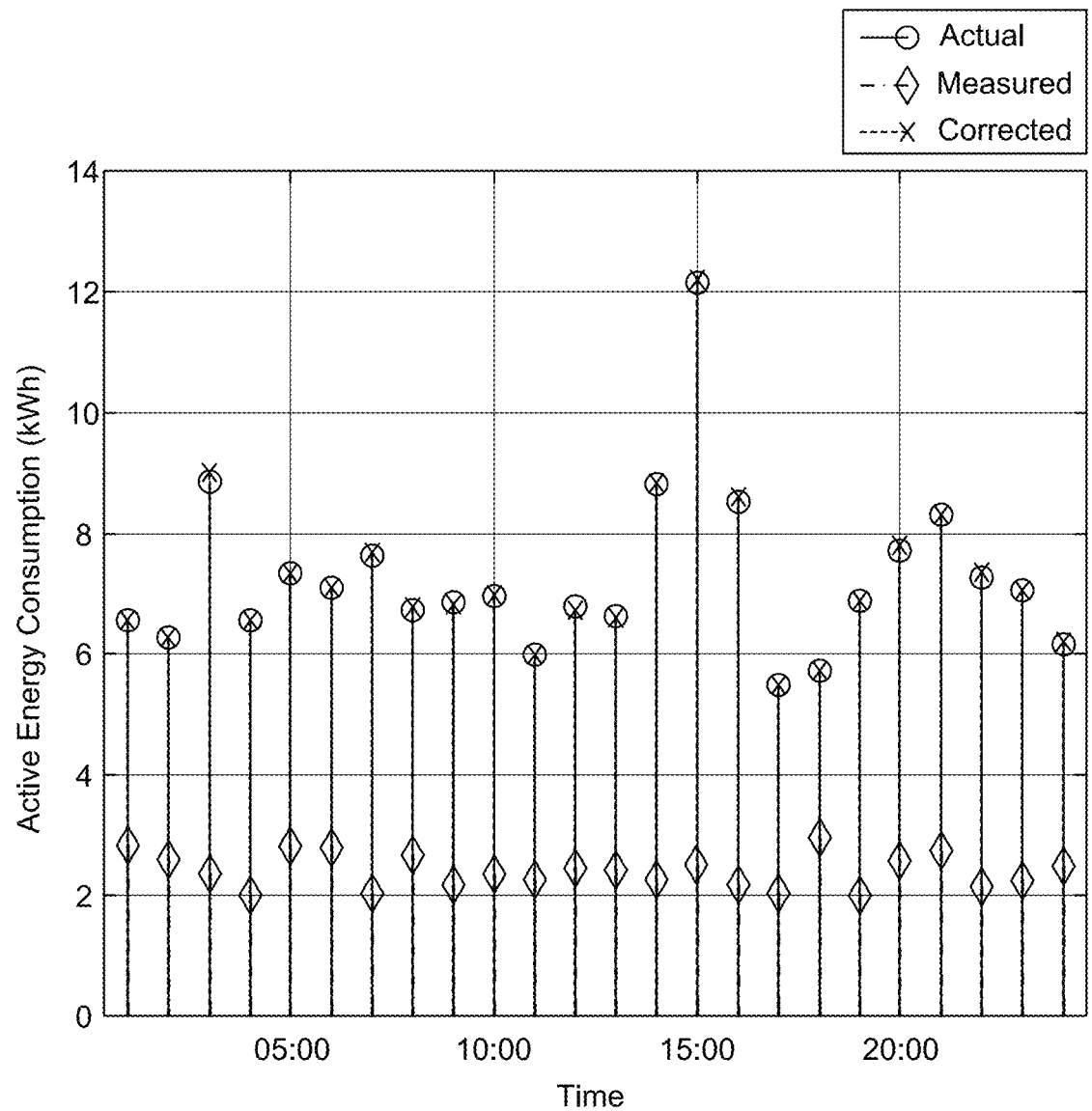
FIG. 12A illustrates a graph of active energy consumption and correction if tampering occurs in a regular meter, according to certain embodiments.

FIG. 12A illustrates a graph of active energy consumption and correction if tampering occurs in a regular meter, according to an embodiment. In this case, as discussed earlier, the active energy, the reactive energy and the area under the squared RMS current curve is considered for the calculation of syndrome vector. These data are received by the utility company and the NTL detection module 210 generates the syndrome vector. The syndrome vector indicates that there is an error or tampering in the regular meter, e.g., the third regular smart meter 204-3. In this case, the locations of the non-zero terms of the syndrome vector would indicate the location of the error in the regular meter, e.g., the third regular smart meter 204-3. In one embodiment, the NTL detection module 210 may determine the active energy and the reactive energy at the sending end rather than the receiving end. Here the sending end may refer to the first end of the power cable connected to the input side of the smart meter wherein the second end of the power cable is coupled to the distribution transformer. The receiving end may refer to the output side of the smart meter wherein the load such as the appliances are coupled.

Figure 12B:
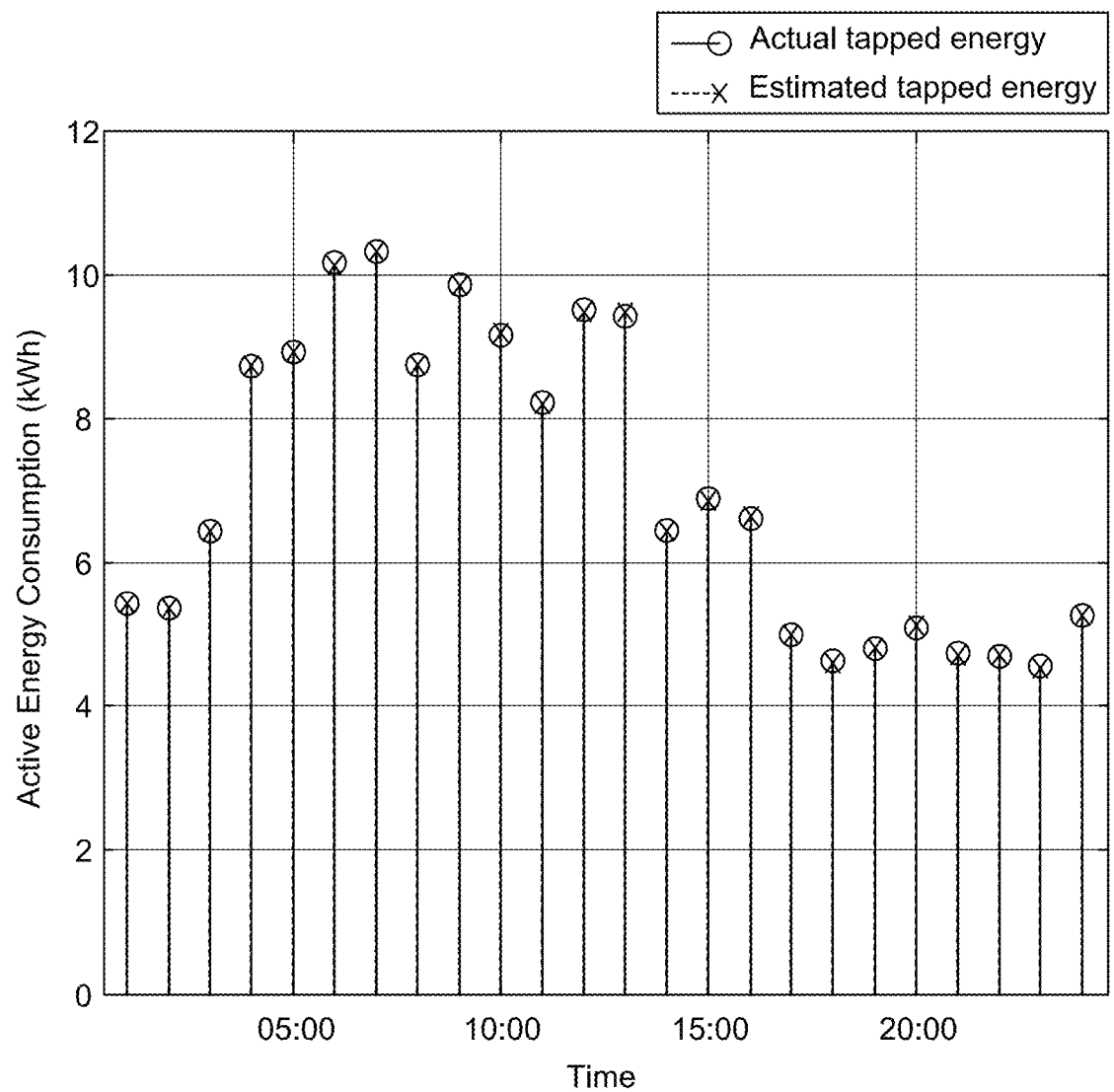
FIG. 12B illustrates a graph of active energy consumption and correction if cable tapping is done on a regular meter, according to certain embodiments.

FIG. 12B illustrates a graph of active energy consumption and correction if cable tapping is done in a regular meter, according to an embodiment. In this case, based upon the values of the syndrome vector, tampering in the smart meter may be identified. The NTL detection module 210 may estimate the active and the reactive energy loss due to cable tapping based on the syndrome vector. The tapped active energy and tapped reactive energy may be determined by the NTL detection module 210 based on the active and reactive energy losses. As shown in the graph of FIG. 12B, the actual tapped energy and the estimated tapped energy after correction using the NTL detection module 210 are almost equal. Accordingly, even in the presence of time skew, actual amount of tapped energy over the power cable is easily identified by the NTL detection module 210.

Figure 13:
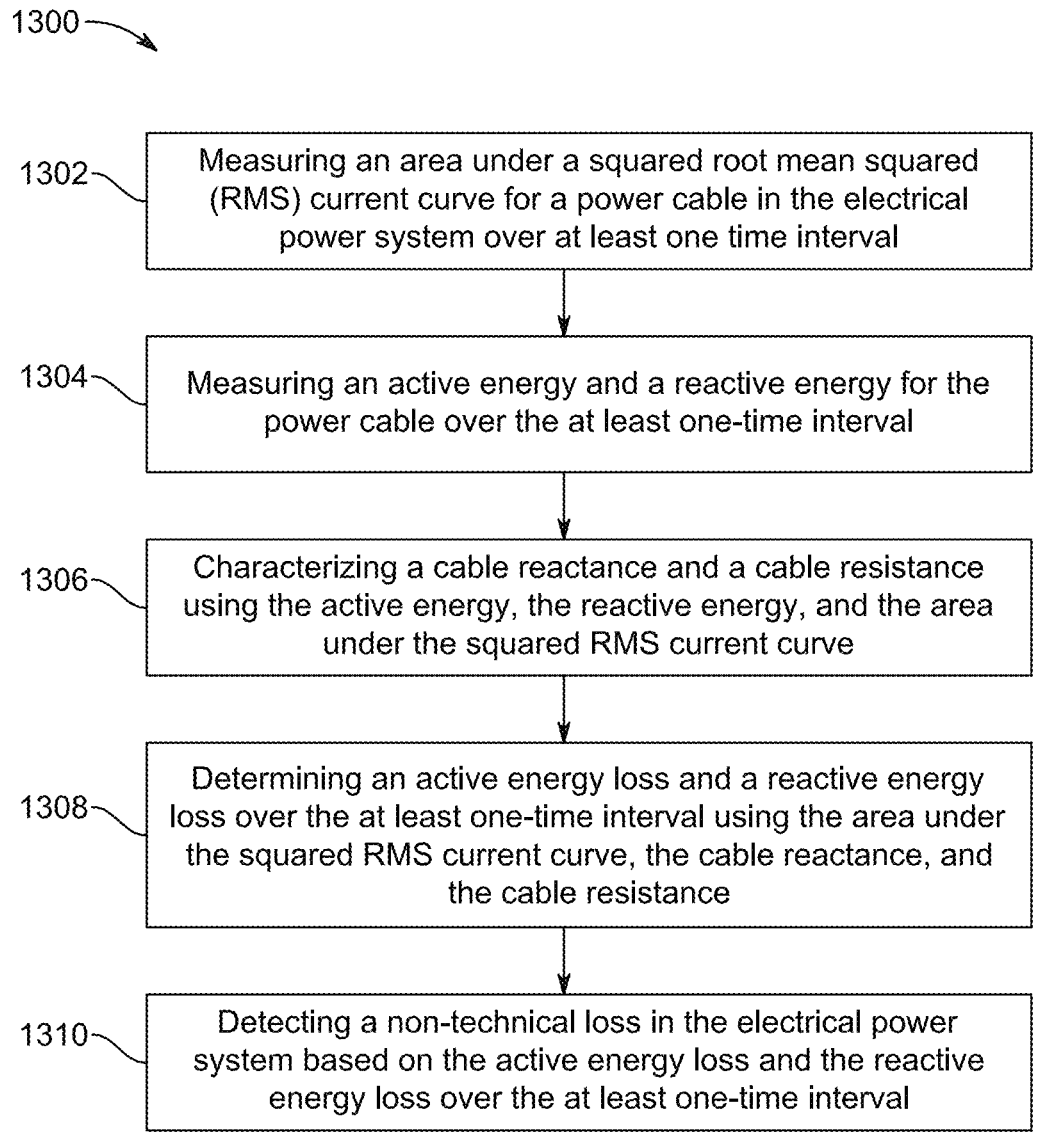
FIG. 13 illustrates a flowchart of a method of detecting NTL in an electrical power system, according to an embodiment of the present disclosure.

FIG. 13 illustrates a flowchart of a method 1300 of detecting non-technical losses (NTL) in an electrical power system, according to an embodiment of the present disclosure. The method 300 is described in conjunction with FIG. 2 through FIG. 4 and a plurality of results illustrated in FIG. 5 through FIG. 12. Various steps of the method 1300 are included through blocks in FIG. 13. One or more blocks may be combined or eliminated to detect non-technical losses (NTL) in the electrical power system without departing from the scope of the present disclosure.

At step 1302, the method 1300 includes measuring an area under a squared root mean squared (RMS) current curve for a power cable 202 in the electrical power system 200 over at least one time interval. As such, each smart meter 204, whether the check meter or the regular meter, may be configured to measure the area under the RMS current curve flowing though the meters based on the loads on each smart meter 204. In an embodiment, the at least one time interval includes either overlapping time intervals or separate time intervals.

At step 1304, the method 1300 includes measuring an active energy and a reactive energy for the power cable 202 over the at least one-time interval. Each of the check smart meter or the regular smart meter are configured to measure the active energy as well as reactive energy consumed through the load connected to each smart meter 204 in the same time interval.

At step 1306, the method 1300 includes characterizing a cable reactance and a cable resistance using the active energy, the reactive energy, and the area under the squared RMS current curve. In one embodiment, each smart meter 204 may solve a plurality of equations using measured active energy and reactive energy in order to find the value of unknown resistance and unknown reactance of the power cable. For example, the active energy and the reactive energy in a power distribution system may be provided by a plurality of equations, as below:

$$E_{p5}(k) - E_{p1}(k) - E_{p2}(k) - E_{p4}(k) = \frac{R_1 A_1(k)}{\alpha} + \frac{R_2 A_2(k)}{\alpha} + \frac{R_4 A_4(k)}{\alpha},$$

$$E_{p6}(k) - E_{p1}(k) - E_{p3}(k) - E_{p4}(k) = \frac{R_1 A_1(k)}{\alpha} + \frac{R_3 A_3(k)}{\alpha} + \frac{R_4 A_4(k)}{\alpha},$$

$$E_{p7}(k) - E_{p2}(k) - E_{p3}(k) - E_{p4}(k) = \frac{R_2 A_2(k)}{\alpha} + \frac{R_3 A_3(k)}{\alpha} + \frac{R_4 A_4(k)}{\alpha},$$

And $$E_{q5}(k) - E_{q1}(k) - E_{q2}(k) - E_{q4}(k) = \frac{X_1 A_1(k)}{\alpha} + \frac{X_2 A_2(k)}{\alpha} + \frac{X_4 A_4(k)}{\alpha},$$

$$E_{q6}(k) - E_{q1}(k) - E_{q3}(k) - E_{q4}(k) = \frac{X_1 A_1(k)}{\alpha} + \frac{X_3 A_3(k)}{\alpha} + \frac{X_4 A_4(k)}{\alpha},$$

$$E_{q7}(k) - E_{q2}(k) - E_{q3}(k) - E_{q4}(k) = \frac{X_2 A_2(k)}{\alpha} + \frac{X_3 A_3(k)}{\alpha} + \frac{X_4 A_4(k)}{\alpha},$$

Using the measured value of the active energy and the reactive energy by each meter for plurality of time intervals, unknown value of resistances as well as reactance that is $R_1$, $R_2$, $R_3$, $R_4$ and $X_1$, $X_2$, $X_3$ and $X_4$ are computed. Accordingly, the resistance and reactance of each power cable 202 connected to each smart meter 204 is computed by each smart meter 204 in the power distribution system 200. In an embodiment, the smart meters 204 may be configured to measure active energy, the reactive energy, and the area under the squared RMS current curve. In one embodiment, these values may be transmitted to a remote power station where the remote power station comprises a system with computer readable instruction to compute the active energy and the reactive energy using plurality of mathematical equations.

At step 1308, the method 1300 includes determining an active energy loss and a reactive energy loss over the at least one-time interval using the area under the squared RMS current curve, the cable reactance, and the cable resistance. Each smart meter 204 may be configured to use the calculated value of the resistance and the reactance of the power cable, in order to find the value of the active and reactive energy loss in the smart meter 104.

$$E_{P_L}(k) = \frac{A(k) \times R}{\alpha},$$

and $$E_{P_L}(k) = \frac{A(k) \times X}{\alpha}$$

Energy loss may be due to the time skew or tampering in the check meter or the regular mater, it may be due to cable tapping or due to cyber-attack on the data of smart meter 204 in the power distribution system 200. In an embodiment, the data comprising active energy, reactive energy and the area under RMS value of the current curve may be transmitted to a remote power station wherein the remote power station comprises a system with computer readable instruction to compute the active energy loss and the reactive energy loss using the mathematical equations 10 and 12.

At step 1310, the method 1300 includes detecting a non-technical loss in the electrical power system based on the active energy loss and the reactive energy loss over the at least one time interval. Each smart meter 204 connected to the power distribution system 200 may be configured to measure the NTL based on the energy losses. Accordingly, the smart meter 204 may define the syndrome vector of active energy as well as reactive energy for each interval. The value of the syndrome vector and the location of non-zero elements in the syndrome vector indicate the location of meters having error or tampering. In an embodiment, based upon the values of syndrome vector, correct measurements are restored in the meters having error due to tampering or time skew. In an embodiment, the data comprising the active energy, reactive energy and the area under RMS value of the current curve may be transmitted to a remote power station wherein the remote power station comprises the system with computer-readable instruction to detect the non-technical loss in the electrical power system over the at least one-time interval. Based upon the calculated NTL, the remote power station may perform inspection of each type of possible loss that occurred in the smart meter 204, that is meter tampering, time skew, cable tapping or cyber-attack. Based upon the calculation of the NTL detection module, the corrected value of the smart meters may be restored. The effect of time skew and other irregularities in smart meter measurement is minimized in detecting the NTL in the electrical power system using active energy, reactive energy, and area under a squared RMS current curve.

To this end, a method to detect non-technical losses in the electrical power system is disclosed wherein the time skew problem in synchronization of the data of smart meters is lowered. Compared to the algorithm used in prior art, where active power, reactive power, and RMS value of the current or voltage are used to identify and/or correct the NTL in the distribution system, the present disclosure proposes a new quantity defined as the area under the squared RMS current curve to be used along with active energy and the reactive energy is used for calculating the NTL. Even in the presence of time skew, the algorithm accurately detects and corrects non-technical losses in practical scenarios. This is also supported with plurality of experimental results disclosed in the disclosure compared to performance and results disclosed in old methods.

Obviously, numerous modifications and variations of the present disclosure will be apparent to the person skilled in the art in light of the above description. For example, in place of a syndrome vector, other parity check matrices such as Hamming code, Huffman code etc. could be used. It is therefore to be understood that within the scope of the appended claims, the disclosure may be practiced otherwise than as specifically described herein.

The invention claimed is:

1. A method for detecting non-technical losses (NTL) in an electrical power system, comprising:
   measuring an area under a squared root mean squared (RMS) current curve for a power cable in the electrical power system over at least one time interval;
   measuring an active energy and a reactive energy for the power cable over the at least one time interval, the at least one time interval being determined based on a continuous moving time window, the continuous moving window configuring a length and an overlap of the at least one time interval;
   characterizing a cable reactance and a cable resistance using a system of independent equations for the at least one time interval, the system of the independent equations using the active energy, the reactive energy, and the area under the squared RMS current curve;
   determining an active energy loss and a reactive energy loss over the at least one time interval using the area under the squared RMS current curve, the cable reactance, and the cable resistance; and
   detecting a non-technical loss in the electrical power system based on the active energy loss and the reactive energy loss over the at least one time interval.

2. The method of claim 1, wherein the at least one time interval includes overlapping time intervals and wherein a first overlap of the overlapping time intervals is automatically adjusted based on a communication bandwidth.

3. The method of claim 1, further comprising correcting for time skew in measurements over the at least one time interval.

4. The method of claim 1, further comprising characterizing the cable reactance and the cable resistance using a least squares method to eliminate noise.

5. The method of claim 1, further comprising detecting smart meter error in the electrical power system.

6. The method of claim 5, further comprising correcting for the smart meter error using the active energy loss and the reactive energy loss for the power cable.

7. The method of claim 1, further comprising detecting a source of the non-technical loss in the electrical power system.

8. The method of claim 1, further comprising determining a location of the non-technical loss in the electrical power system.

9. The method of claim 1, further comprising estimating an amount of energy tapped from the power cable using the active energy loss and the reactive energy loss.

10. The method of claim 1, wherein the system of the independent equations uses a combination of measurements from at least one smart meter, the combination of the measurements being based on a configuration matrix, the configuration matrix being a binary matrix wherein each row of a plurality of rows of the configuration matrix includes more than one 1.

11. A system for detecting non-technical losses (NTL), comprising:
- a power cable in an electrical power system; and
- at least one smart meter in the electrical power system;
- wherein the at least one smart meter is configured to measure an area under a squared root mean squared (RMS) current curve for the power cable over at least one time interval, the at least one time interval being determined by a continuous moving time window, the continuous moving window configuring a length and an overlap of the at least one time interval;
- wherein the at least one smart meter is configured to measure an active energy and a reactive energy for the power cable over the at least one time interval;
- wherein the at least one smart meter is configured to characterize a cable reactance and a cable resistance using a system of independent equations for the at least one time interval, the system of the independent equations using the active energy, the reactive energy, and the area under the squared RMS current curve;
- wherein the at least one smart meter is configured to determine an active energy loss and a reactive energy loss for the electrical power system using the area under the squared RMS current curve, the active energy, and the reactive energy; and
- wherein the at least one smart meter is configured to detect a non-technical loss in the electrical power system based on the active energy loss and the reactive energy loss over the at least one time interval.

12. The system of claim 11, wherein the at least one smart meter is connected to a distribution transformer and wherein the at least one smart meter is configured to detect a plurality of loads on the electrical power system.

13. The system of claim 12, wherein the at least one smart meter is configured to detect a load associated with the non-technical loss from the plurality of loads.

14. The system of claim 11, wherein the at least one time interval includes overlapping time intervals and wherein a first overlap of the overlapping time intervals is automatically adjusted based on a communication bandwidth of the system.

15. The system of claim 11, wherein the at least one smart meter is further configured to correct for time skew in measurements over the at least one time interval.

16. The system of claim 11, wherein the at least one smart meter is further configured to detect a source of the non-technical loss in the electrical power system.

17. The system of claim 11, wherein the at least one smart meter is further configured to determine a location of the non-technical loss.

18. The system of claim 11, wherein the at least one smart meter is further configured to correct for smart meter error using the active energy loss and the reactive energy loss of the power cable.

19. The system of claim 11, wherein the at least one smart meter is further configured to estimate an amount of energy tapped from the power cable using the active energy loss and the reactive energy loss.

20. The system of claim 11, wherein the system of the independent equations uses a combination of measurements from the at least one smart meter, the combination of the measurements being based on a configuration matrix, the configuration matrix being a binary matrix wherein each row of a plurality of rows of the configuration matrix includes more than one 1.

\* \* \* \* \*